US010109485B2

(12) United States Patent
Ogihara et al.

(10) Patent No.: US 10,109,485 B2
(45) Date of Patent: Oct. 23, 2018

(54) SILICON-CONTAINING CONDENSATE, COMPOSITION FOR FORMING A SILICON-CONTAINING RESIST UNDER LAYER FILM, AND PATTERNING PROCESS

(71) Applicant: SHIN-ETSU CHEMICAL CO., LTD., Tokyo (JP)

(72) Inventors: Tsutomu Ogihara, Jyoetsu (JP); Keisuke Niida, Jyoetsu (JP); Yasuyuki Yamamoto, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 38 days.

(21) Appl. No.: 15/340,264

(22) Filed: Nov. 1, 2016

(65) Prior Publication Data
US 2017/0154766 A1  Jun. 1, 2017

(30) Foreign Application Priority Data

Nov. 27, 2015 (JP) ................................. 2015-231438

(51) Int. Cl.
*G03F 7/004* (2006.01)
*H01L 21/027* (2006.01)
(Continued)

(52) U.S. Cl.
CPC .......... *H01L 21/0273* (2013.01); *C08G 77/52* (2013.01); *C08G 77/80* (2013.01);
(Continued)

(58) Field of Classification Search
CPC . G03F 7/004; G03F 7/038; G03F 7/11; G03F 7/26; G03F 7/38; G03F 7/40;
(Continued)

(56) References Cited

U.S. PATENT DOCUMENTS 3,427,339 A * 2/1969 Plueddemann ....... C07F 7/0834
528/10
3,427,340 A * 2/1969 Plueddemann ....... C07F 7/0834
528/10
(Continued)

FOREIGN PATENT DOCUMENTS

JP  2008-033174 A  2/2008
JP  2009-126940 A  6/2009
(Continued)

OTHER PUBLICATIONS

Machine translation of JP 2017-082173 (no date).*
Machine translation of JP 2016-180017 (no date).*

Maenhoudt et al., "Double Patterning scheme for sub-0.25 kl single damascene structures at NA=0.75, λ=193nm" Optical Microlithography XVIII, vol. 5754, pp. 1508-1518, 2005.

*Primary Examiner* — Amanda C. Walke
(74) *Attorney, Agent, or Firm* — Oliff PLC

(57) ABSTRACT

The present invention provides a silicon-containing condensate comprising one or more repeating units selected from a repeating unit shown by the following general formula (A1), a repeating unit shown by the following general formula (A2), and a repeating unit shown by the following general formula (A3), wherein $R^1$ represents a group shown by the following general formula (A-1) or (A-2); $R^2$ and $R^3$ each independently represent the same group as $R^1$, a hydrogen atom, or a monovalent organic group having 1 to 30 carbon atoms other than $R^1$.

There can be provided a silicon-containing condensate to give a composition for forming a silicon-containing resist under layer film which can form a resist under layer film with good adhesiveness to any resist pattern, whether the pattern is formed by negative development or positive development.

19 Claims, No Drawings

(51) Int. Cl.
*G03F 7/038* (2006.01)
*G03F 7/26* (2006.01)
*G03F 7/40* (2006.01)
*G03F 7/38* (2006.01)
*H01L 21/308* (2006.01)
*H01L 21/311* (2006.01)
*C08G 77/52* (2006.01)
*C09D 183/14* (2006.01)
*G03F 7/039* (2006.01)
*G03F 7/11* (2006.01)
*G03F 7/16* (2006.01)
*G03F 7/20* (2006.01)
*G03F 7/32* (2006.01)
*H01L 21/033* (2006.01)
*H01L 21/3213* (2006.01)
*G03F 7/075* (2006.01)
*G03F 7/09* (2006.01)
*C08G 77/00* (2006.01)

(52) U.S. Cl.
CPC ......... *C09D 183/14* (2013.01); *G03F 7/0045* (2013.01); *G03F 7/038* (2013.01); *G03F 7/0397* (2013.01); *G03F 7/0752* (2013.01); *G03F 7/094* (2013.01); *G03F 7/11* (2013.01); *G03F 7/162* (2013.01); *G03F 7/168* (2013.01); *G03F 7/2006* (2013.01); *G03F 7/2041* (2013.01); *G03F 7/26* (2013.01); *G03F 7/327* (2013.01); *G03F 7/38* (2013.01); *G03F 7/40* (2013.01); *H01L 21/0274* (2013.01); *H01L 21/0276* (2013.01); *H01L 21/0332* (2013.01); *H01L 21/0337* (2013.01); *H01L 21/3081* (2013.01); *H01L 21/3086* (2013.01); *H01L 21/31105* (2013.01); *H01L 21/31138* (2013.01); *H01L 21/31144* (2013.01); *H01L 21/32139* (2013.01)

(58) Field of Classification Search
CPC ... C08L 83/04; C09D 183/04; H01L 21/0274; H01L 21/0276; H01L 21/314; H01L 21/311; H01L 21/31105; H01L 21/3081; H01L 21/3086

USPC ....... 430/311, 313, 314, 317, 322, 325, 329, 430/330, 331, 271.1; 438/703
See application file for complete search history.

(56) References Cited

U.S. PATENT DOCUMENTS

| | | | |
|---|---|---|---|
| 8,329,376 B2 * | 12/2012 | Ogihara | H01L 21/02282 430/270.1 |
| 9,312,127 B2 * | 4/2016 | Ogihara | H01L 21/31116 |
| 9,817,312 B2 * | 11/2017 | Yoshida | G03F 7/0757 |
| 2009/0136869 A1 | 5/2009 | Ogihara et al. | |
| 2010/0003622 A1 | 1/2010 | Matsumaru et al. | |
| 2010/0233632 A1 * | 9/2010 | Kawazu | C08G 77/04 430/323 |
| 2010/0285407 A1 | 11/2010 | Ogihara et al. | |
| 2012/0276483 A1 * | 11/2012 | Ogihara | G03F 7/0752 430/319 |
| 2013/0280912 A1 | 10/2013 | Ogihara et al. | |
| 2013/0284698 A1 * | 10/2013 | Ogihara | G03F 7/0002 216/48 |
| 2014/0120730 A1 * | 5/2014 | Nakajima | G03F 7/40 438/703 |
| 2014/0205951 A1 | 7/2014 | Ogihara et al. | |
| 2014/0234785 A1 * | 8/2014 | Hatakeyama | G03F 7/40 430/326 |
| 2014/0249326 A1 * | 9/2014 | Paulasaari | C07F 7/0859 556/451 |
| 2015/0079792 A1 * | 3/2015 | Shigaki | H01L 21/3081 438/703 |
| 2016/0096977 A1 * | 4/2016 | Tachibana | C09D 183/10 257/618 |

FOREIGN PATENT DOCUMENTS

| | | | | |
|---|---|---|---|---|
| JP | 2010-262230 A | 11/2010 | | |
| JP | 2013-224279 A | 10/2013 | | |
| JP | 2014-141585 A | 8/2014 | | |
| JP | WO 2016080226 A1 * | 5/2016 | | C07F 7/18 |
| JP | 2016180017 A * | 10/2016 | | C08F 230/08 |
| JP | 2016197176 A * | 11/2016 | | |
| JP | 2017082173 A * | 5/2017 | | |

* cited by examiner

SILICON-CONTAINING CONDENSATE, COMPOSITION FOR FORMING A SILICON-CONTAINING RESIST UNDER LAYER FILM, AND PATTERNING PROCESS

BACKGROUND OF INVENTION

Technical Field

The present invention relates to a silicon-containing condensate, a composition containing the same for forming a silicon-containing resist under layer film, and a patterning process using the same.

Background Art

In 1980s, photo-exposure using g-beam (436 nm) or i-beam (365 nm) of mercury lamp as a light source had been widely used in the resist patterning. As a means for finer patterning, shifting to a exposure light having shorter wavelength was assumed to be effective, so that, for the mass production process of DRAM (Dynamic Random Access Memory) with 64 MB (work size of 0.25 µm or less) in 1990s and later ones, KrF excimer laser (248 nm), whose wavelength is shorter than i-beam (365 nm), had been used in place of i-beam as the exposure light source. However, for production of DRAM with integration of 256 MB and 1 GB or higher requiring further finer processing technologies (work size of 0.2 µm or less), a light source having a further shorter wavelength was required, and thus, a photolithography using ArF excimer laser (193 nm) has been investigated seriously over a decade. It was expected at first that the ArF lithography would be applied to the fabrication of 180 nm-node devices. However, the KrF excimer lithography survived to the mass production of 130 nm-node devices, so that a full-fledged application of the ArF lithography started from the 90 nm-node. Furthermore, mass production of the 65 nm-node devices is now underway by combining the ArF lithography with a lens having an increased numerical aperture (NA) of 0.9. For the next 45 nm-node devices, further shortening the wavelength of exposure light is progressing, and the $F_2$ lithography with 157 nm wavelength became a candidate. However, there are many problems in the $F_2$ lithography: cost-up of a scanner due to use of a large quantities of expensive $CaF_2$ single crystal for a projection lens; extremely poor durability of a soft pellicle, which leads to change of an optical system due to introduction of a hard pellicle; decrease in etching resistance of a resist film, and so forth. Because of these problems, development of the $F_2$ lithography was suspended, and ArF immersion lithography was introduced.

In the ArF immersion lithography, water having a refractive index of 1.44 is introduced between a projection lens and a wafer by a partial fill method. This enables high speed scanning, and mass production of the 45 nm-node devices is now underway by using a lens with a NA of 1.3.

For the 32 nm-node lithography, a lithography with an extreme ultraviolet beam (EUV) of 13.5 nm wavelength is considered to be a candidate. Unfortunately, the EUV lithography has problems such as needs for a higher output power of the laser, a higher sensitivity of the resist film, a higher resolution, a lower line edge roughness (LER), a non-defect MoSi laminate mask, a lower aberration of the reflective mirror, and so forth; and thus, there are innumerable problems to be solved. Development of the immersion lithography with a high refractive index, which is another candidate for the 32 nm-node, was suspended because of low transmittance of LUAG, a candidate for a high refractive index lens, and an inability to obtain a target value of a liquid's refractive index at 1.8. As mentioned above, in the photo-exposure used as a general technology, resolution based on the wavelength of a light source is approaching to its inherent limit.

In recent years, a double patterning process, in which a first pattern is formed by first exposure and development, and then a pattern is formed exactly in the space of the first pattern by second exposure, is drawing an attention as a miniaturization technology (Non-Patent Document 1). Many processes are proposed as the double patterning process. One example is a method (1) that includes forming a photoresist pattern with an interval rate of a line to a space of 1:3 by first exposure and development; processing an under layer hard mask by dry etching; laying another hard mask thereon; forming a second line pattern by subjecting the photoresist film to exposure and development at a space obtained by the first exposure; processing the hard mask by dry etching to form a line and space pattern having half pitch of the first pattern. Also, there is another method (2) that includes forming a photoresist pattern with an interval rate of a space to a line of 1:3 by first exposure and development; processing an under layer hard mask by dry etching; applying a photoresist film thereon; forming a pattern on a remaining portion of the hard mask by second exposure; and processing the hard mask by dry etching using the pattern as a mask. In both methods, the hard mask is processed by dry etching twice.

To perform the dry etching only once, there is a method in which a negative resist composition is used in the first exposure and a positive resist composition is used in the second exposure. In addition, there is a method in which a positive resist composition is used in the first exposure and a negative resist composition dissolved in higher alcohol having 4 or more carbon, in which the positive resist composition does not dissolve, is used in the second exposure.

As an alternative method, there has been proposed a method in which a first pattern formed by first exposure and development is treated with a reactive metal compound to insolubilize the pattern, and then a second pattern is newly formed between the first patterns by exposure and development (Patent Document 1).

As mentioned above, to form a finer pattern, many methods have been investigated. Among them, the common object is to prevent the collapse of a fine pattern to be formed. To accomplish this object, it is desired to further improve adhesiveness between an upper resist pattern and a resist under layer film.

PRIOR ART DOCUMENTS

Patent Documents

Patent Document 1: Japanese Patent Laid-Open Publication No. 2008-033174
Non-Patent Document 1: Proc. SPIE Vol. 5754 p1508 (2005)

SUMMARY OF INVENTION

The present invention was accomplished in view of the above-described problems. An object of the present invention is to provide a composition for forming a silicon-containing resist under layer film which can form a resist under layer film with good adhesiveness to any resist pattern, whether the pattern is formed by negative development or positive development; and provide a silicon-containing condensate that can give the composition for forming a silicon-containing resist under layer film.

To achieve the object, the present invention provides a silicon-containing condensate comprising one or more repeating units selected from a repeating unit shown by the following general formula (A1), a repeating unit shown by the following general formula (A2), and a repeating unit shown by the following general formula (A3),

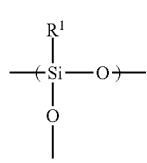
(A1)

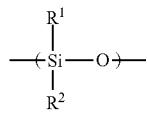
(A2)

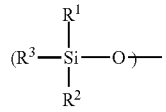
(A3)

wherein R¹ represents a group shown by the following general formula (A-1) or the following general formula (A-2); R² and R³ each independently represent the same group as R¹, a hydrogen atom, or a monovalent organic group having 1 to 30 carbon atoms other than R¹,

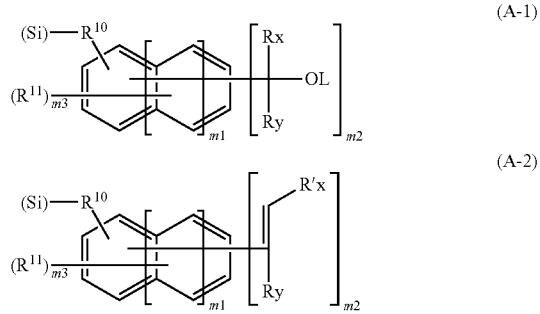
(A-1)

(A-2)

wherein R¹⁰ represents a single bond or an alkylene group having 1 to 10 carbon atoms, and when R¹⁰ is an alkylene group, R¹⁰ optionally contains one or more species selected from an ether oxygen atom, a carbonyl group, and a carbonyloxy group at a site which is not directly bonded to (Si) in the formula; R¹¹ represents a hydrogen atom, a halogen atom, a linear, branched, or cyclic acyloxy group having 2 to 8 carbon atoms, a linear, branched, or cyclic alkyl group having 1 to 6 carbon atoms, or a linear, branched, or cyclic alkoxy group having 1 to 6 carbon atoms in which a hydrogen atom in the acyloxy group, the alkyl group, and the alkoxy group is optionally substituted with a halogen atom; Rx, R'x, and Ry each independently represent a hydrogen atom or a monovalent aliphatic hydrocarbon group having 1 to 15 carbon atoms in which a hydrogen atom in the monovalent aliphatic hydrocarbon group is optionally substituted with a hydroxy group or an alkoxy group, and each Ry optionally bonds to Rx or R'x respectively to form a cyclic structure, with the proviso that the both of Rx and Ry are not hydrogen atoms at the same time; L represents a hydrogen atom, a linear, branched, or cyclic monovalent aliphatic hydrocarbon group having 1 to 10 carbon atoms, or a monovalent aromatic group which optionally contains a substituent, and when L is a monovalent aliphatic hydrocarbon group, L optionally contains one or more species selected from an ether oxygen atom, a carbonyl group, and a carbonyloxy group; m1 represents an integer of 0 to 2, m2 represents an integer of 1 to 3, and m3 represents an integer satisfying (5+2×m1−m2); and (Si) represents a bonding site to Si.

Such a silicon-containing condensate can give a composition for forming a silicon-containing resist under layer film which can form a resist under layer film with good adhesiveness to any resist pattern, whether the pattern is formed by negative development or positive development.

The present invention also provides a composition for forming a silicon-containing resist under layer film, comprising:
(A) the foregoing silicon-containing condensate, and
(B) a polysiloxane compound other than the component (A).

Such a composition for forming a silicon-containing resist under layer film can form a resist under layer film with good adhesiveness to any resist pattern, whether the pattern is formed by negative development or positive development.

It is preferred that the polysiloxane compound of the component (B) contain a repeating unit derived from a tetrafunctional hydrolyzable monomer, in a ratio of 50 mol % or more of all the repeating unit in the polysiloxane compound.

It is also preferred that a mass ratio between the component (A) and the component (B) be (B)≥(A).

By using the inventive silicon-containing condensate with an appropriate mass ratio and with an appropriate compound, it is possible to obtain a composition capable of forming a resist under layer film having not only excellent etching selectivity and pattern adhesiveness but also patterning properties stable in both negative development and positive development.

In addition, the present invention provides a patterning process comprising: forming an organic film on a body to be processed by using a coating-type organic film material; forming a resist under layer film on the organic film by using the foregoing composition for forming a silicon-containing resist under layer film; forming a resist upper layer film on the resist under layer film by using a resist upper layer film material composed of a photoresist composition; forming a circuit pattern in the resist upper layer film; transferring the pattern to the resist under layer film by dry etching using the resist upper layer film having the formed pattern as a mask; transferring the pattern to the organic film by dry etching using the resist under layer film having the transferred pattern as a mask; and transferring the pattern to the body to be processed by dry etching using the organic film having the transferred pattern as a mask.

Such a patterning process can form a fine pattern while suppressing a pattern collapse in both negative development and positive development when the coating-type organic film is formed under the resist under layer film.

It is preferred that the coating-type organic film material contain a compound having an aromatic ring.

By using such a coating-type organic film material, an occurrence of pattern collapse can be further suppressed.

The present invention also provides a patterning process comprising: forming a hard mask mainly consisting of carbon on a body to be processed by a CVD method; forming a resist under layer film on the CVD hard mask by using the foregoing composition for forming a silicon-containing resist under layer film; forming a resist upper layer film on the resist under layer film by using a resist upper layer film material composed of a photoresist composition; forming a circuit pattern in the resist upper layer film; transferring the pattern to the resist under layer film by dry etching using the resist upper layer film having the formed pattern as a mask; transferring the pattern to the CVD hard mask by dry etching using the resist under layer film having the transferred pattern as a mask; and further transferring the pattern to the body to be processed by dry etching using the CVD hard mask having the transferred pattern as a mask.

Such a patterning process can form a fine pattern while suppressing a pattern collapse in both negative development and positive development when the CVD hard mask is formed under the resist under layer film.

In forming the circuit pattern, it is preferable to form the circuit pattern by a lithography using light with a wavelength of 10 nm or more and 300 nm or less, a direct drawing by electron beam, a nanoimprinting, or a combination thereof.

In forming the circuit pattern, it is preferable to develop the circuit pattern by alkaline development or organic solvent development.

In the inventive patterning process, such means for forming and developing a circuit pattern can be preferably used.

The body to be processed is preferably a semiconductor apparatus substrate or the semiconductor apparatus substrate coated with any of a metal film, a metal carbide film, a metal oxide film, a metal nitride film, a metal oxycarbide film, and a metal oxynitride film.

Moreover, the metal of the body to be processed is preferably any of silicon, titanium, tungsten, hafnium, zirconium, chromium, germanium, copper, aluminum, indium, gallium, arsenic, palladium, iron, tantalum, iridium, molybdenum, or an alloy thereof.

The patterning process of the present invention can form a pattern by processing the body to be processed such as the ones mentioned above.

As mentioned above, when a resist under layer film is formed by using a composition that contains the inventive silicon-containing condensate, a pattern having excellent surface roughness can be formed without pattern collapse in both alkaline development (positive development) and organic solvent development (negative development) since the resist under layer film becomes excellent in adhesiveness with the resist pattern. Further, since this resist under layer film has high etching selectivity between the resist under layer film and an organic material, the formed photoresist pattern (the circuit pattern formed in the resist upper layer film) can be successively transferred to the resist under layer film and the organic film or the CVD carbon film (the CVD hard mask mainly consisting of carbon) by dry etching process. Especially, as the manufacturing process of a semiconductor apparatus progresses toward further miniaturization in recent years, the resist upper layer film is made thinner in order to prevent pattern collapse after development, which leads to difficulty in pattern transfer to the resist under layer film. However, when the inventive composition for forming a silicon-containing resist under layer film is used, the pattern can be transferred to the substrate with high precision while suppressing the deformation of the resist upper layer pattern during dry etching even if a thinned resist upper layer film is used as an etching mask. In addition, in practical manufacturing process of a semiconductor apparatus, all the patterning steps are not replaced to the negative development, but an ultrafine step which is only a part of the steps is replaced; and thus, it may be assumed that the conventional positive development step remains unchanged. In this case, if the resist under layer film is solely dedicated to negative development or positive development, the equipment and quality control may become complicated. On the other hand, when a composition for forming a silicon-containing resist under layer film usable in both positive and negative processes, like the one in the present invention, is used, rational management is possible in both equipment and quality control.

DESCRIPTION OF EMBODIMENTS

As mentioned above, it has been desired to develop a composition for forming a silicon-containing resist under layer film which can form a resist under layer film with good adhesiveness to any resist pattern, whether the pattern is formed by negative development or positive development.

So far, the present inventors have proposed a composition for forming a silicon-containing resist under layer film in which the contact angle is decreased at the exposed part by blending a polymer having an acid-labile group and a polymer not having the same with an appropriate ratio to improve adhesiveness of a negative pattern (Japanese Patent Laid-Open Publication No. 2013-224279). To bring good adhesiveness of the resist under layer film with both negative development pattern and positive development pattern, the present inventors have focused an attention on the surface structure of the resist under layer film. As a result of diligent study, they found that when a component having an organic group that generates reactive active species by the effect of heat or acid as a partial structure is blended into a composition for forming a resist under layer film as a surface modifier, the organic group occurs a chain reaction on the surface of the coating film (the resist under layer film); and thus not only adhesiveness of the under layer film to the upper layer resist pattern is improved, but also a pattern shape without foot printing can be obtained, thereby bringing the present invention to completion.

That is, the present invention is a silicon-containing condensate comprising one or more repeating units selected from a repeating unit shown by the following general formula (A1), a repeating unit shown by the following general formula (A2), and a repeating unit shown by the following general formula (A3),

(A1)

(A2)

(A3)

wherein $R^1$ represents a group shown by the following general formula (A-1) or the following general formula (A-2); $R^2$ and $R^3$ each independently represent the same group as R¹, a hydrogen atom, or a monovalent organic group having 1 to 30 carbon atoms other than R¹,

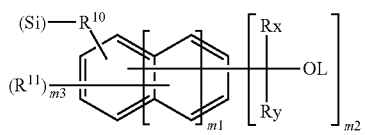
(A-1)

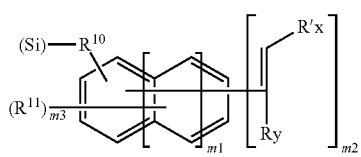
(A-2)

wherein $R^{10}$ represents a single bond or an alkylene group having 1 to 10 carbon atoms, and when $R^{10}$ is an alkylene group, $R^{10}$ optionally contains one or more species selected from an ether oxygen atom, a carbonyl group, and a carbonyloxy group at a site which is not directly bonded to (Si) in the formula; $R^{11}$ represents a hydrogen atom, a halogen atom, a linear, branched, or cyclic acyloxy group having 2 to 8 carbon atoms, a linear, branched, or cyclic alkyl group having 1 to 6 carbon atoms, or a linear, branched, or cyclic alkoxy group having 1 to 6 carbon atoms in which a hydrogen atom in the acyloxy group, the alkyl group, and the alkoxy group is optionally substituted with a halogen atom; Rx, R'x, and Ry each independently represent a hydrogen atom or a monovalent aliphatic hydrocarbon group having 1 to 15 carbon atoms in which a hydrogen atom in the monovalent aliphatic hydrocarbon group is optionally substituted with a hydroxy group or an alkoxy group, and each Ry optionally bonds to Rx or R'x respectively to form a cyclic structure, with the proviso that the both of Rx and Ry are not hydrogen atoms at the same time; L represents a hydrogen atom, a linear, branched, or cyclic monovalent aliphatic hydrocarbon group having 1 to 10 carbon atoms, or a monovalent aromatic group which optionally contains a substituent, and when L is a monovalent aliphatic hydrocarbon group, L optionally contains one or more species selected from an ether oxygen atom, a carbonyl group, and a carbonyloxy group; m1 represents an integer of 0 to 2, m2 represents an integer of 1 to 3, and m3 represents an integer satisfying (5+2×m1−m2); and (Si) represents a bonding site to Si.

Hereinafter, the present invention will be described specifically, but the present invention is not limited thereto. Incidentally, in this description, "Me" represents a methyl group, and "Ac" represents an acetyl group.

<Silicon-Containing Condensate>

The silicon-containing condensate of the present invention contains one or more repeating units selected from a repeating unit shown by the general formula (A1), a repeating unit shown by the general formula (A2), and a repeating unit shown by the general formula (A3). In the inventive silicon-containing condensate, the group (the partial structure) shown by the general formula (A-1) or the general formula (A-2), which is contained as a substituent (R¹) in the repeating unit shown by the general formulae (A1), (A2), and (A3), generates reactive active species by the effect of heat or acid. These species are polymerized by a chain reaction with each other, and enhance the organic property of the surface of a silicon-containing film (a resist under layer film) which contains this condensate, thereby improving the adhesiveness to a resist upper layer film pattern.

Hereinafter, R¹ in the general formulae (A1), (A2), and (A3) (i.e., a group represented by the general formula (A-1) or the general formula (A-2)) will be specifically described.

The group shown by the general formula (A-1) has an OL group capable of easily leaving by effect of heat, acid or both of them (hereinafter, also referred to as a "heat/acid leaving group") on the carbon atom directly bonded to the aromatic ring as the characteristic structure. In the present invention, reactive active species are generated by leaving the heat/acid leaving group by effect of heat, acid or both of them, and these species occur a chain reaction, thereby changing the film surface, as shown below. As a result, adhesiveness to the pattern is improved, and a film surface excellent in pattern shape can be obtained.

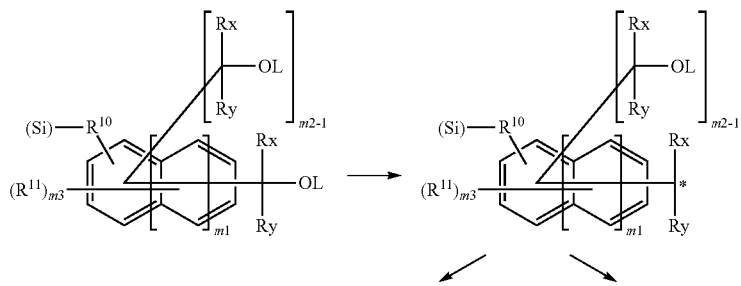

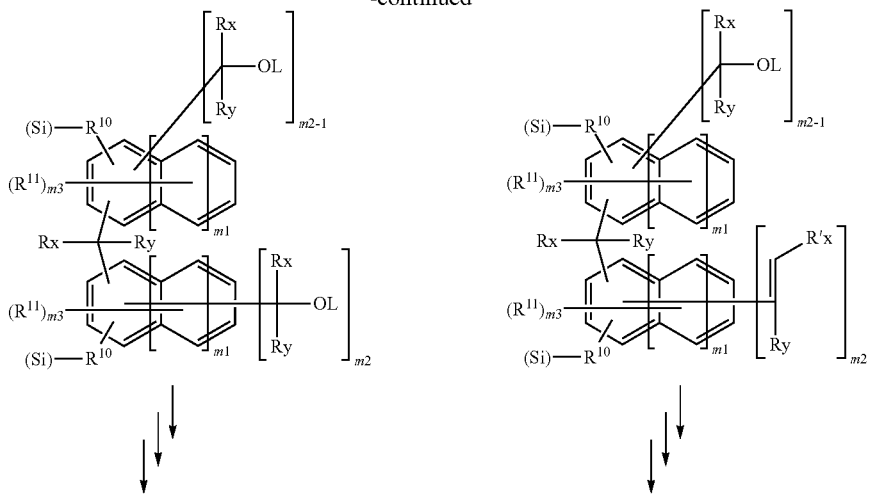

The group shown by the general formula (A-2) has a double bond on the carbon atom directly bonded to the aromatic ring as the characteristic structure. In the present invention, reactive active species are generated from the double bond by effect of heat, acid or both of them, and these species occur a chain reaction, thereby changing the film surface, as shown below. As a result, adhesiveness to the pattern is improved, and a film surface excellent in pattern shape can be obtained.

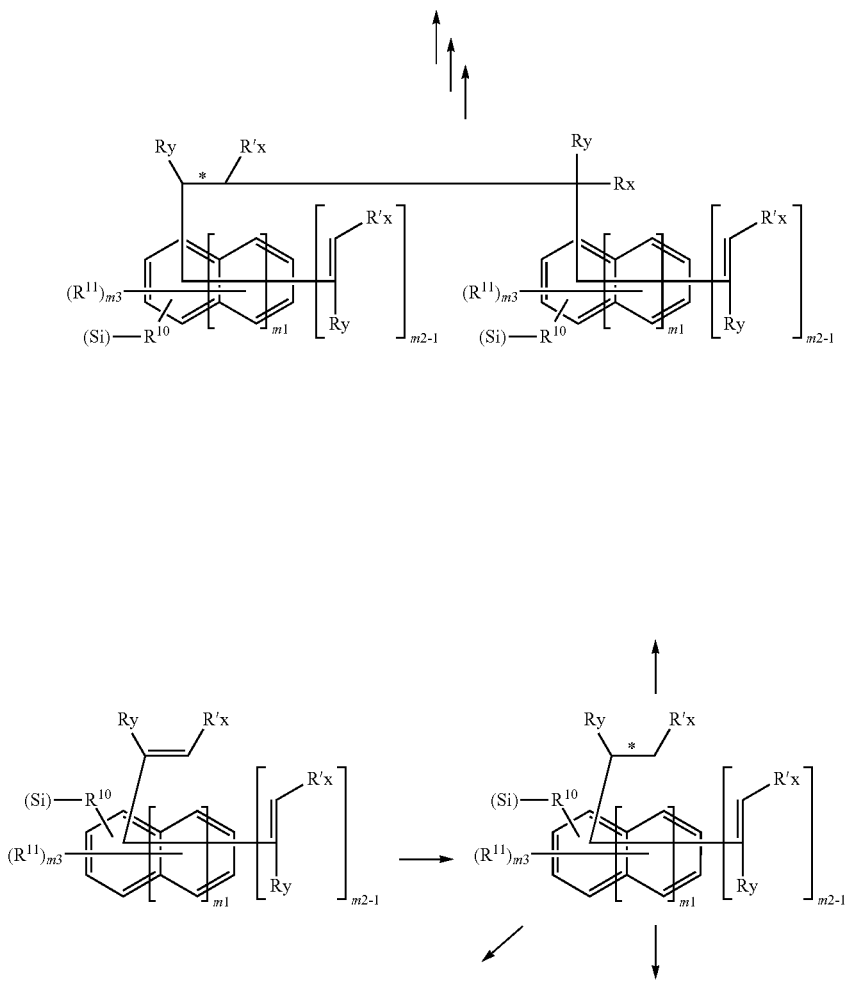

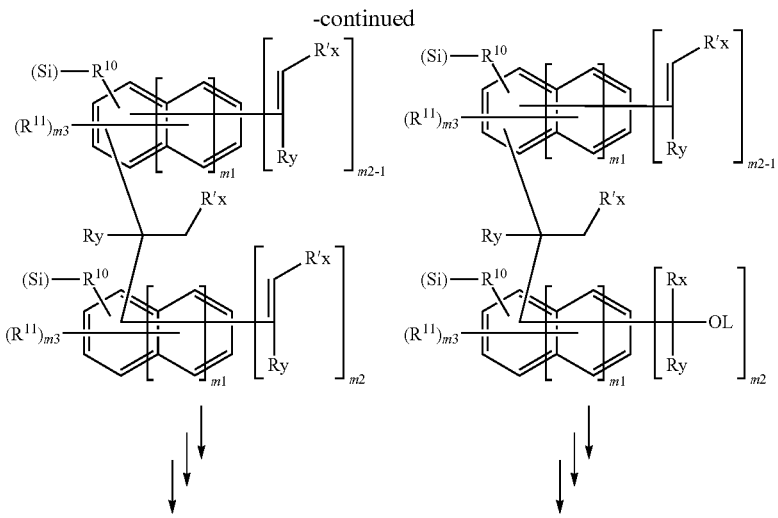

It is to be noted that the reactive active species generated from the heat/acid leaving group in the group shown by the general formula (A-1) or the double bond in the group shown by the general formula (A-2) can react not only with a compound having a group shown by the general formula (A-1) or (A-2) but also with a compound which is susceptive to aromatic electrophilic substitution reaction such as a compound having an electron-donating substituent. Illustrative examples thereof include a resin having a phenolic hydroxy group such as a phenol-formaldehyde resin and a polyhydroxystyrene resin.

These reactions are not always occur separately. In some cases, the reaction proceeds by a chain reaction with the heat/acid leaving group leaves; and in some cases, a double bond is formed at first by leaving the heat/acid leaving group, and then the reaction proceeds by a chain reaction as shown below.

which is not directly bonded to (Si) in the formula. Illustrative examples of the preferable alkylene group include a methylene group, an ethylene group, a propylene group, a butylene group, a pentylene group, a hexylene group, or a structural isomer of these groups having a branched or cyclic structure. In case of containing one or more species selected from an ether oxygen atom, a carbonyl group, and a carbonyloxy group, the species can be contained at any site as long as the site is not directly bonded to a silicon atom (Si) in the formula.

In the general formulae (A-1) and (A-2), $R^{11}$ represents a hydrogen atom, a halogen atom, a linear, branched, or cyclic acyloxy group having 2 to 8 carbon atoms, a linear, branched, or cyclic alkyl group having 1 to 6 carbon atoms, or a linear, branched, or cyclic alkoxy group having 1 to 6 carbon atoms in which a hydrogen atom in the acyloxy group, the alkyl group, and the alkoxy group is optionally

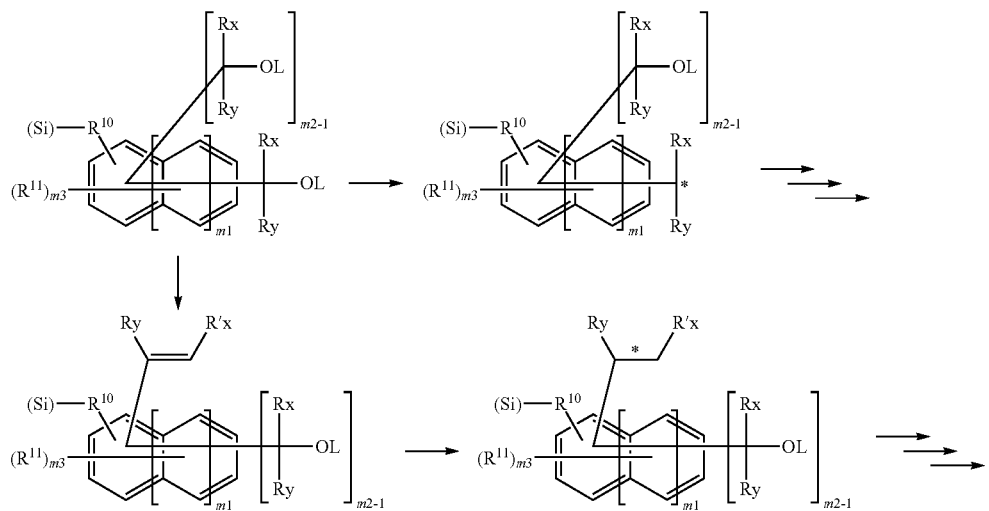

In the general formulae (A-1) and (A-2), $R^{10}$ represents a single bond or an alkylene group having 1 to 10 carbon atoms, and when $R^{10}$ is an alkylene group, $R^{10}$ optionally contains one or more species selected from an ether oxygen atom, a carbonyl group, and a carbonyloxy group at a site substituted with a halogen atom. Incidentally, as the halogen atom in $R^{11}$, fluorine, chlorine, bromine, and so on are preferable. As the acyloxy group, an acetoxy group and so on are preferable. Illustrative examples of the preferable alkyl group include a methyl group and an ethyl group.

Illustrative examples of the preferable alkoxy group include a methoxy group and an ethoxy group.

In the general formulae (A-1) and (A-2), Rx, R'x, and Ry each independently represent a hydrogen atom or a monovalent aliphatic hydrocarbon group having 1 to 15 carbon atoms in which a hydrogen atom in the monovalent aliphatic hydrocarbon group is optionally substituted with a hydroxy group or an alkoxy group, and each Ry optionally bonds to Rx or R'x respectively to form a cyclic structure, with the proviso that the both of Rx and Ry are not hydrogen atoms at the same time. Incidentally, as the monovalent aliphatic hydrocarbon group, a linear, branched, or cyclic alkyl group and so on are exemplified. Illustrative examples of these Rx, R'x, and Ry include a methyl group, an ethyl group, a propyl group, a butyl group, these groups in which the hydrogen atom is substituted with a hydroxy group or an alkoxy group, and a cyclic monovalent aliphatic hydrocarbon group having 5 to 15 carbon atoms.

As described above, Rx and Ry may be bonded with each other to form a cyclic structure. As the alicyclic group formed by bonding Rx and Ry, the following groups are exemplified. Herein, "C" in the formulae represents a carbon atom to which Rx and Ry are bonded.

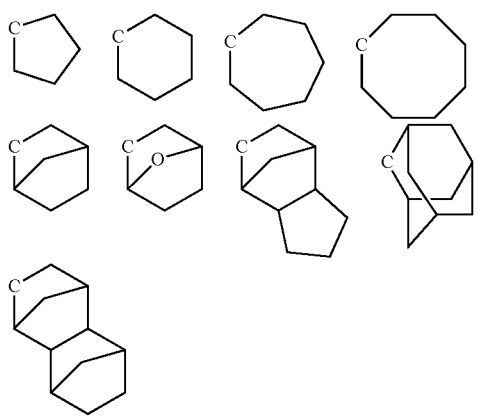

As described above, R'x and Ry may be bonded with each other to form a cyclic structure. As the alicyclic group formed by bonding R'x and Ry, the following groups are exemplified. Herein, "C" in the formulae represents a carbon atom to which Ry is bonded.

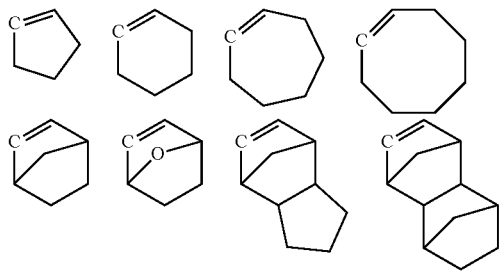

In the general formula (A-1), L represents a hydrogen atom, a linear, branched, or cyclic monovalent aliphatic hydrocarbon group having 1 to 10 carbon atoms, or a monovalent aromatic group which optionally contains a substituent, and when L is a monovalent aliphatic hydrocarbon group, L optionally contains one or more species selected from an ether oxygen atom, a carbonyl group, and a carbonyloxy group. Illustrative examples of preferable L include a hydrogen atom, a methyl group, an ethyl group, a propyl group, an isopropyl group, a cyclopentyl group, a cyclohexyl group, an adamantyl group, a methylcarbonyl group, a phenyl group.

In the general formulae (A-1) and (A-2), m1 represents an integer of 0 to 2. This m1 represents the number of the aromatic ring, and the aromatic ring moiety in the formula is a benzene ring when m1=0, a naphthalene ring when m1=1, and an anthracene ring when m1=2. In addition, m2 is an integer of 1 to 3, and represents a number of the partial structure having the heat/acid leaving group or the double bond; m3 is an integer satisfying (5+2×m1−m2), and represents a number of the $R^{11}$. Incidentally, (Si) represents a bonding site to Si (i.e., the silicon atom bonded to $R^1$ in the formulae (A1) to (A3)).

As the group shown by the general formulae (A-1) and (A-2) (i.e. $R^1$), the ones shown by the general formulae (A-1a) and (A-2a) (i.e. the ones in which m1-0) are particularly preferable,

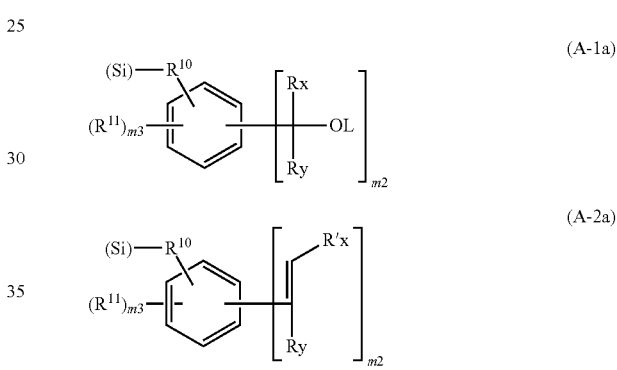

wherein $R^{10}$, $R^{11}$, Rx, R'x, Ry, L, m2, and m3 represent the same meanings as defined above.

When $R^1$ is a group shown by the general formula (A-1), the following are illustrated as preferable examples.

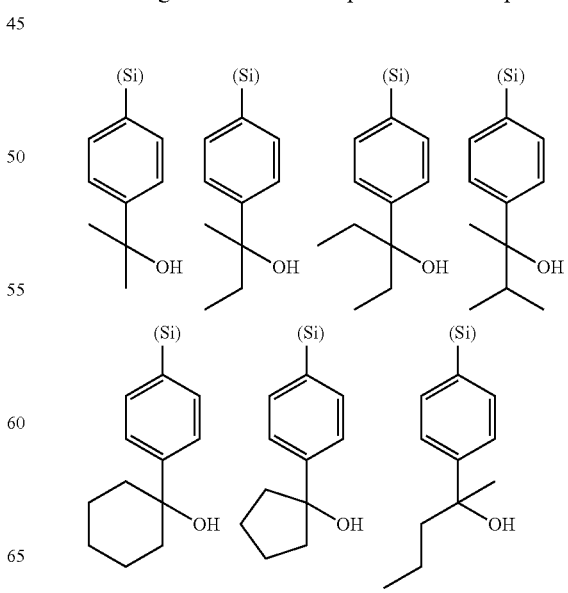

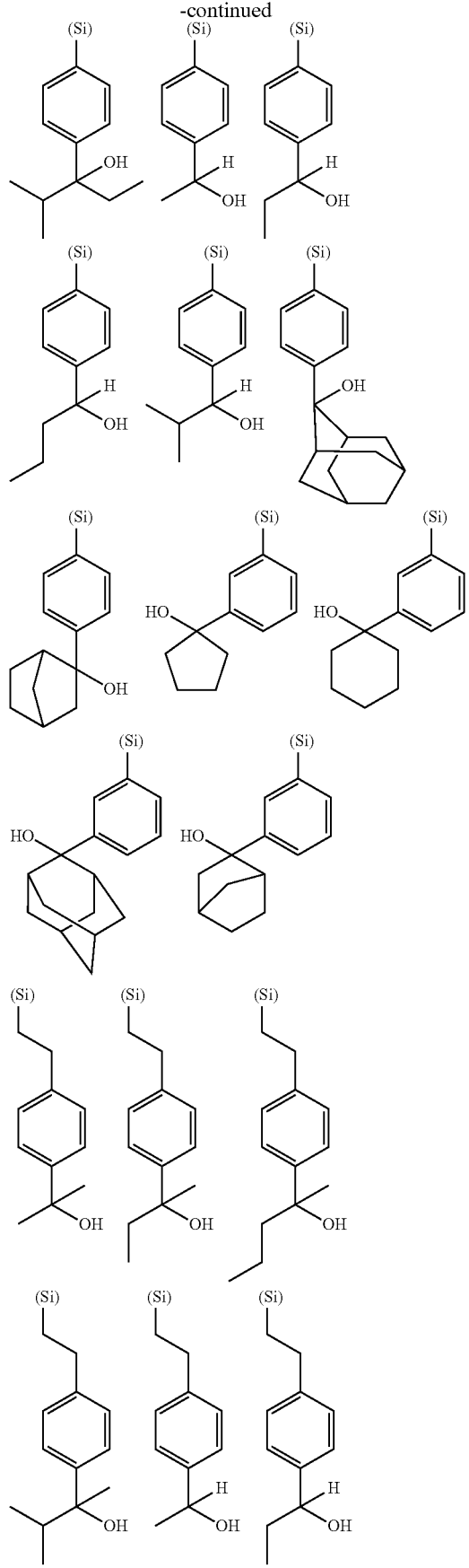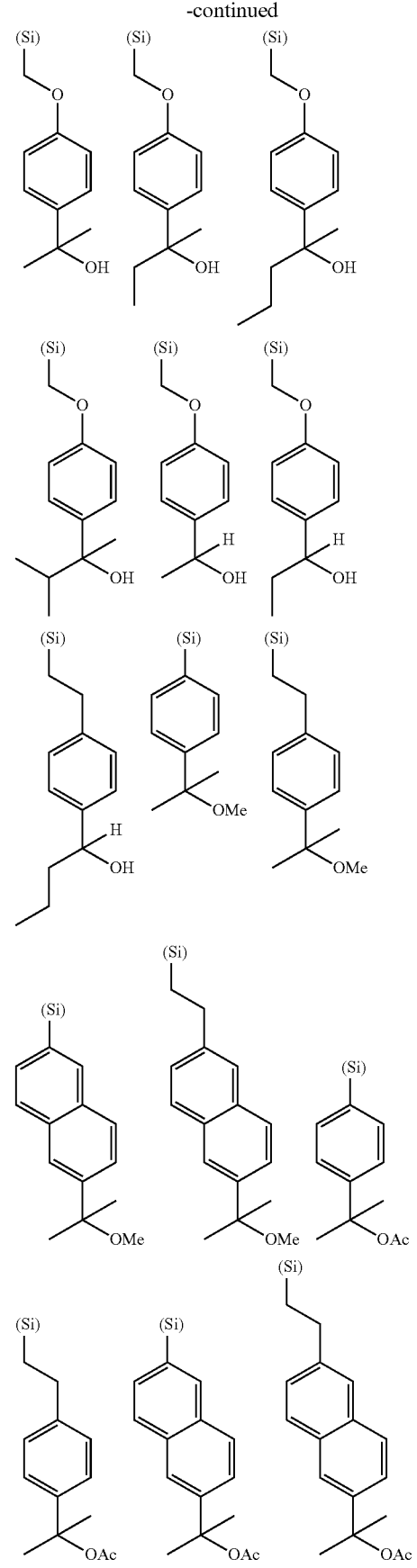

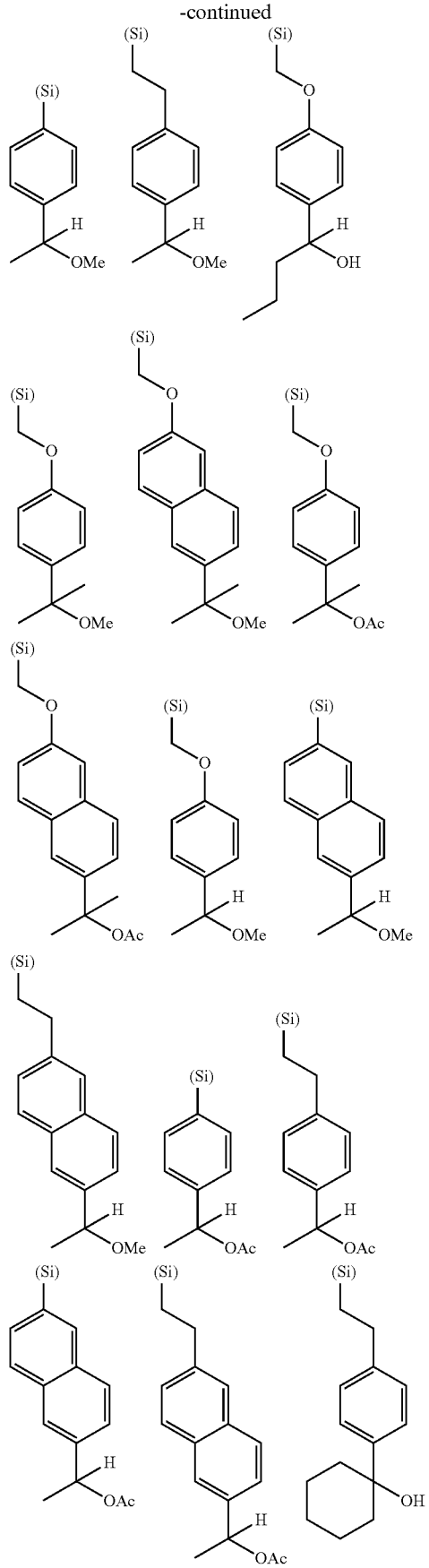
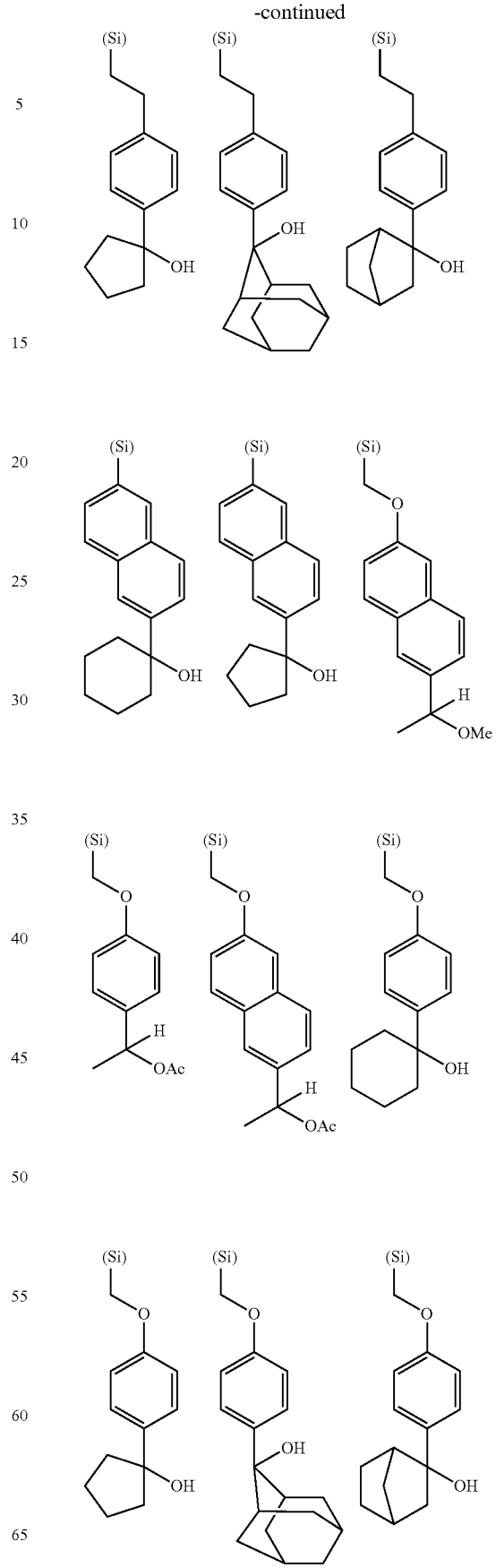

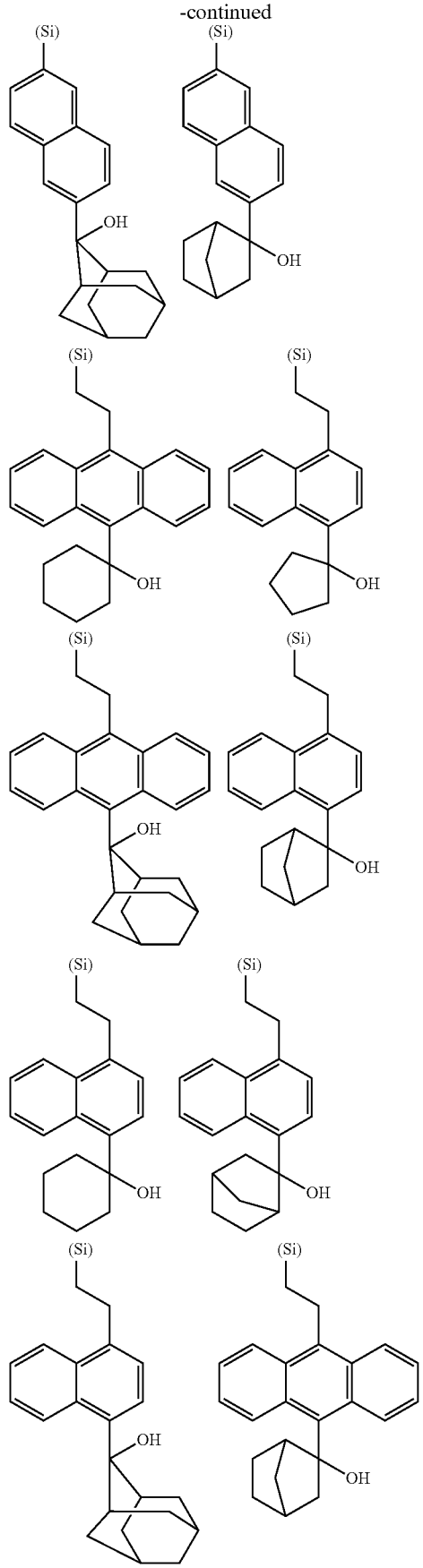
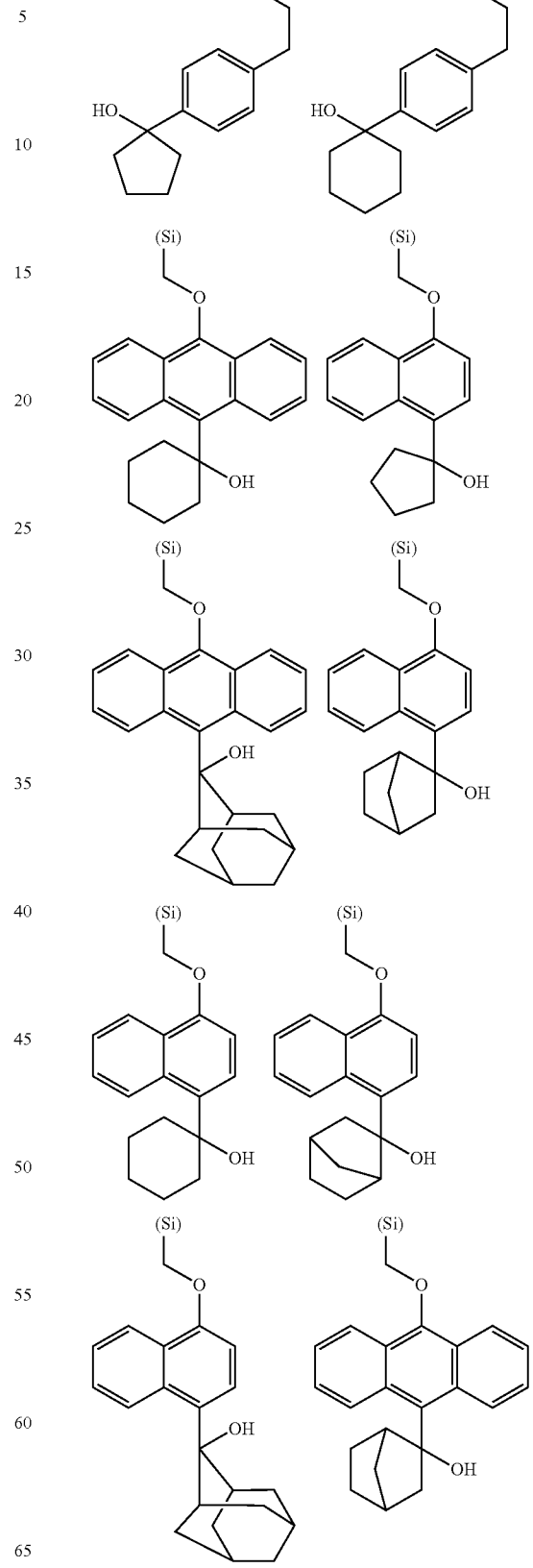

-continued
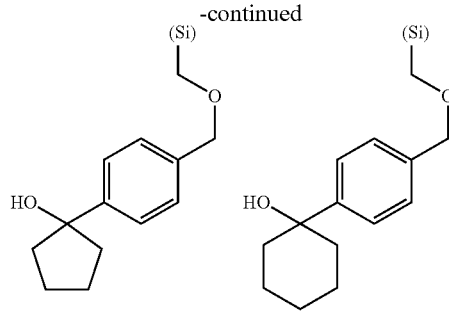
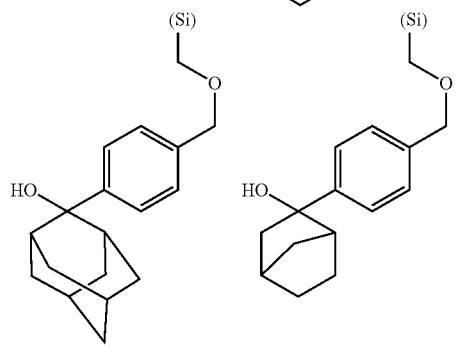
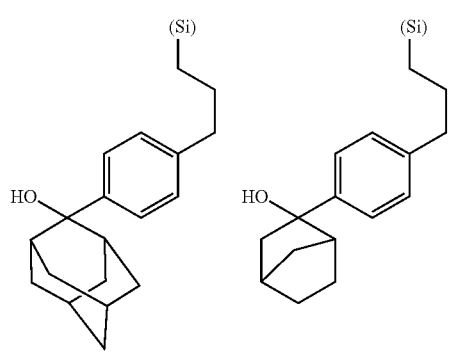
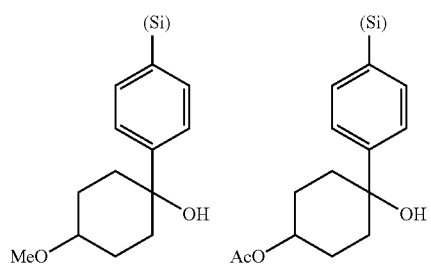
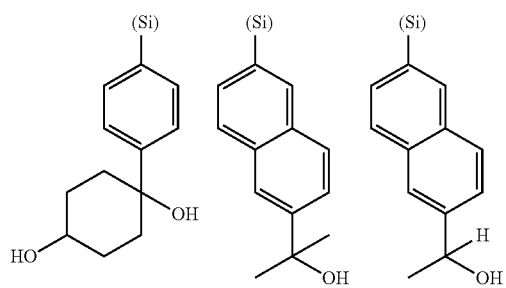
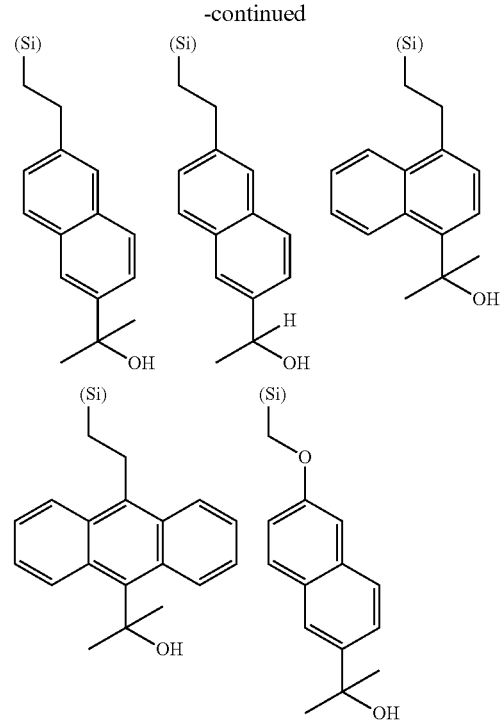
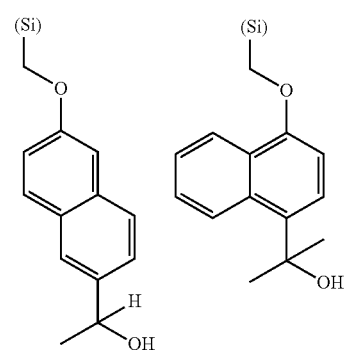
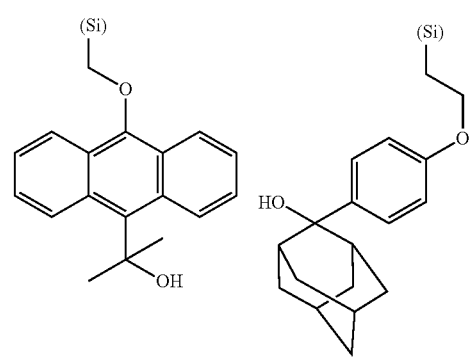
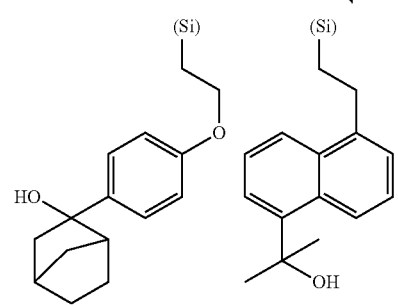

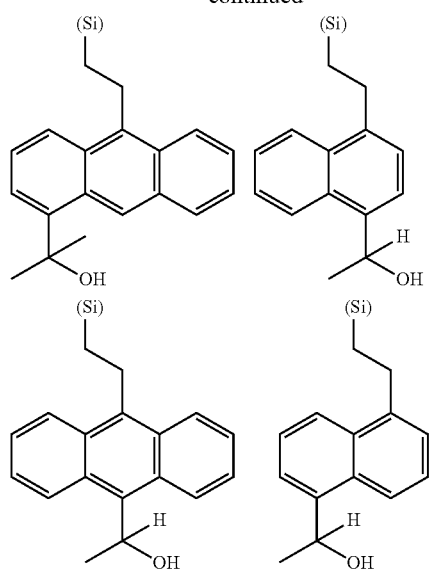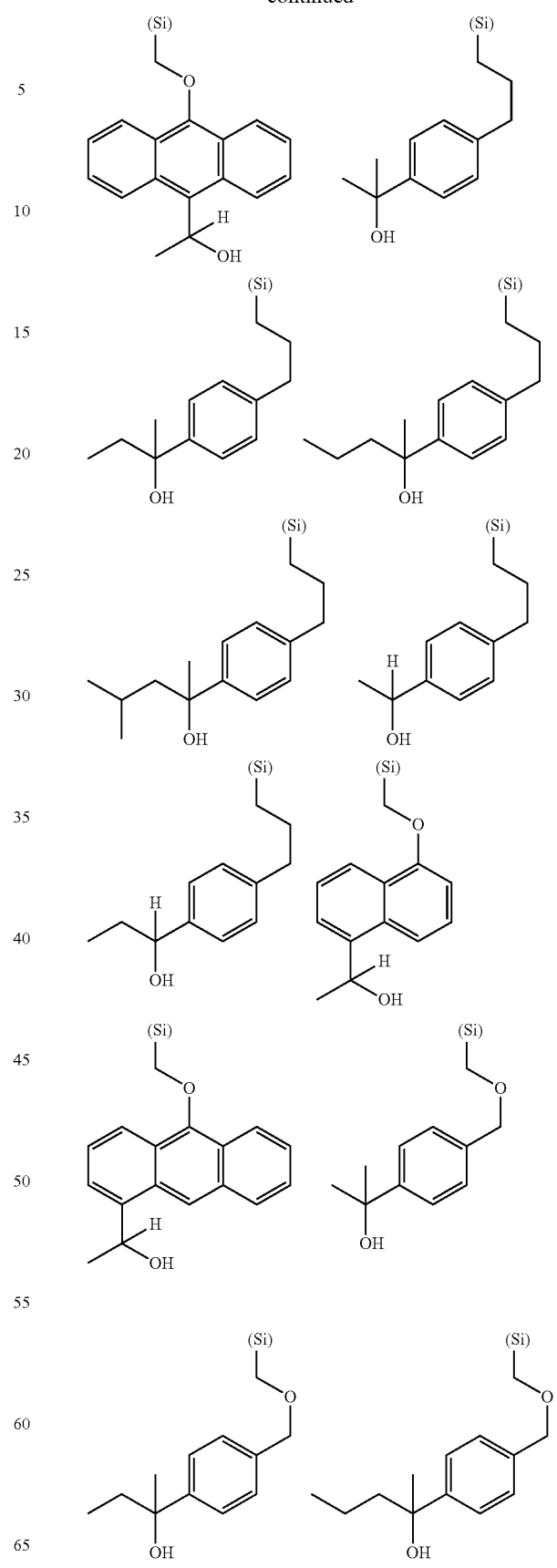

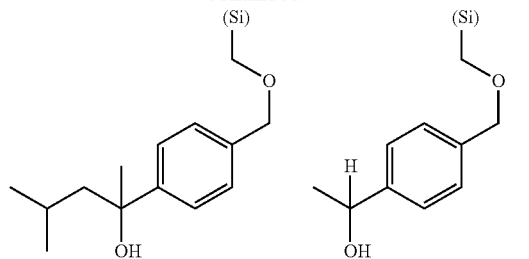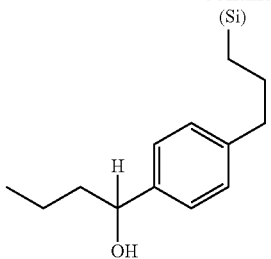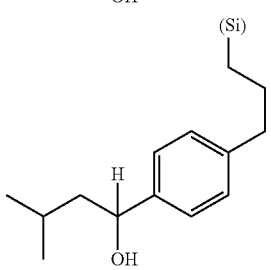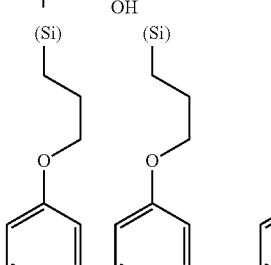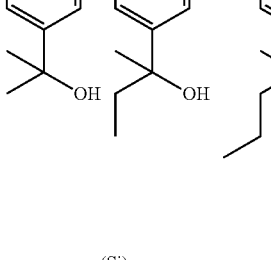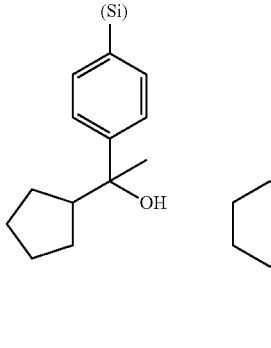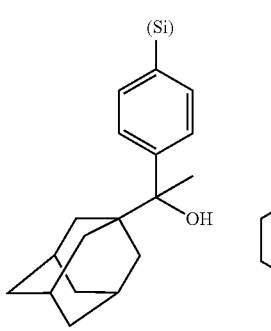

-continued
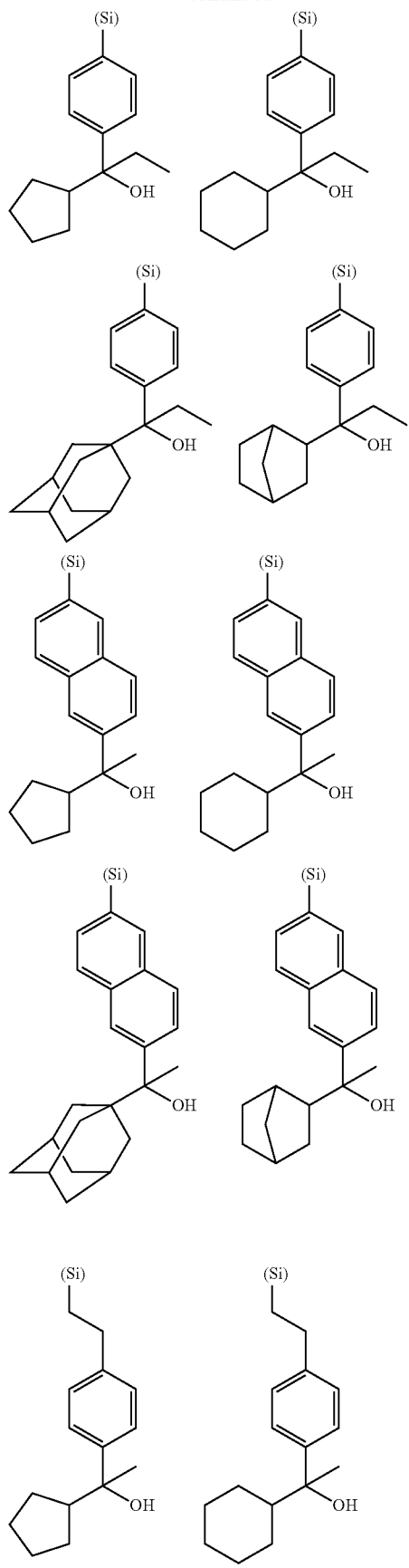
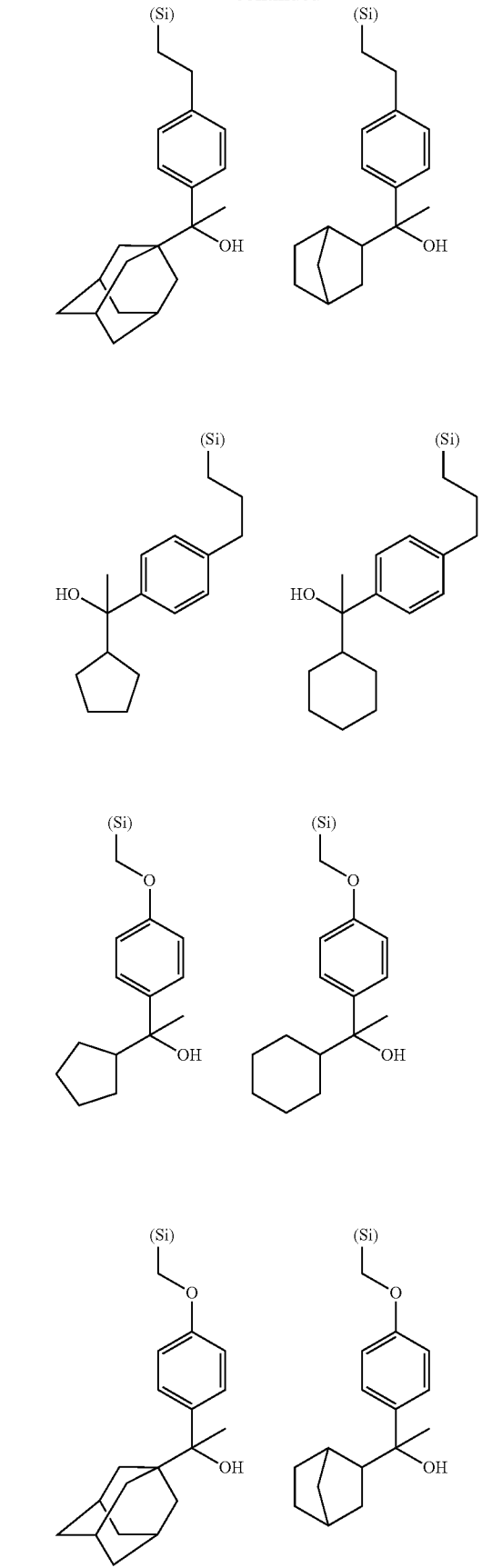

-continued
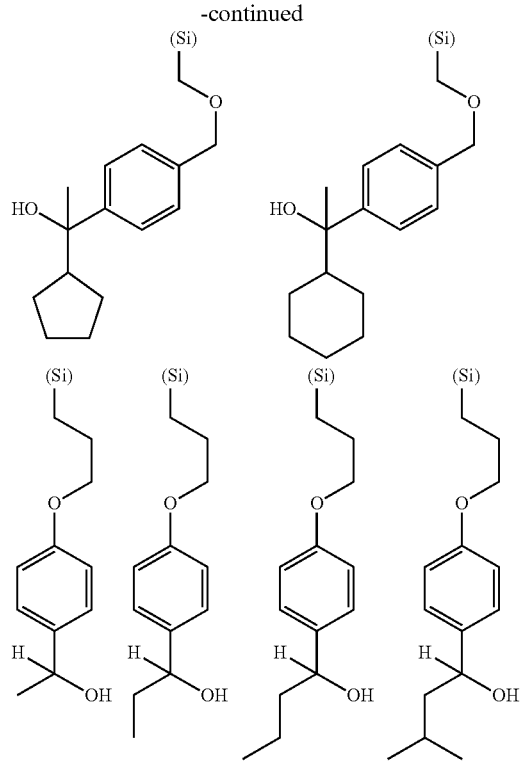
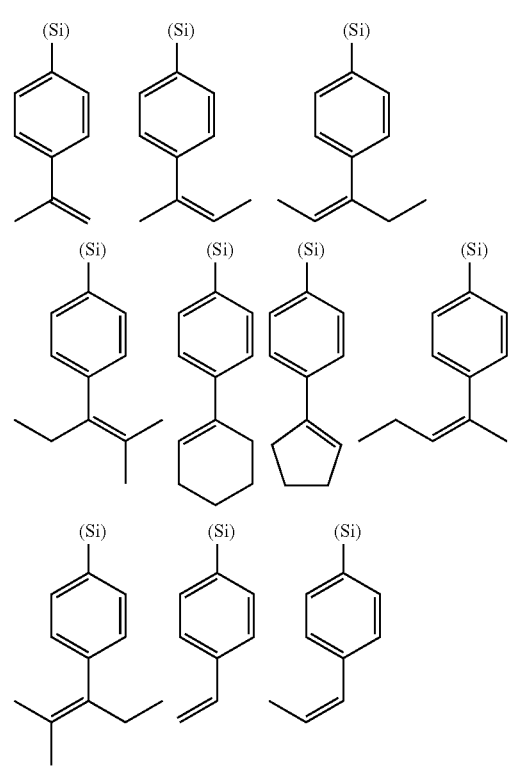
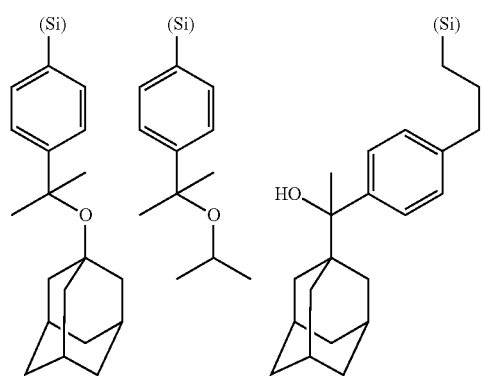
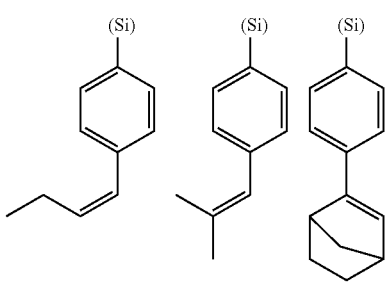
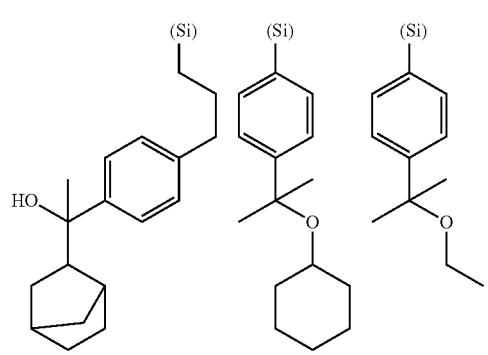
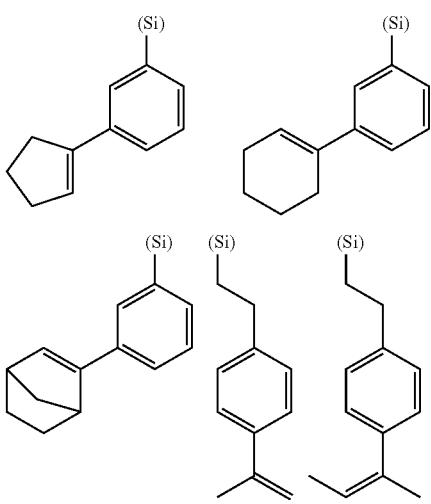
When R¹ is a group shown by the general formula (A-2), the following are illustrated as preferable examples.

-continued
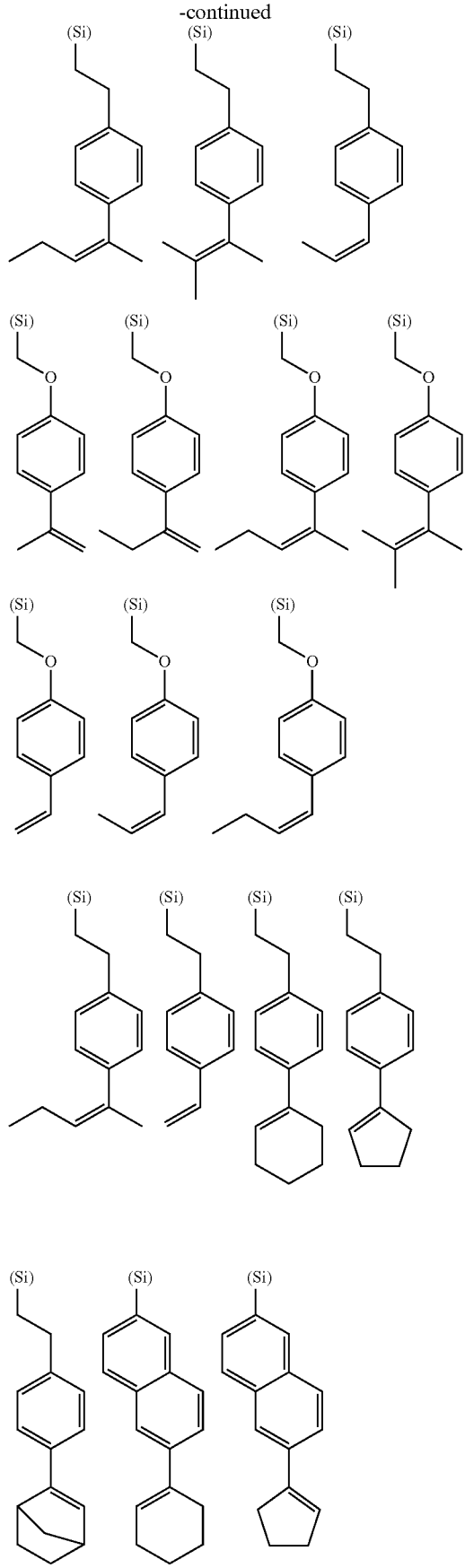
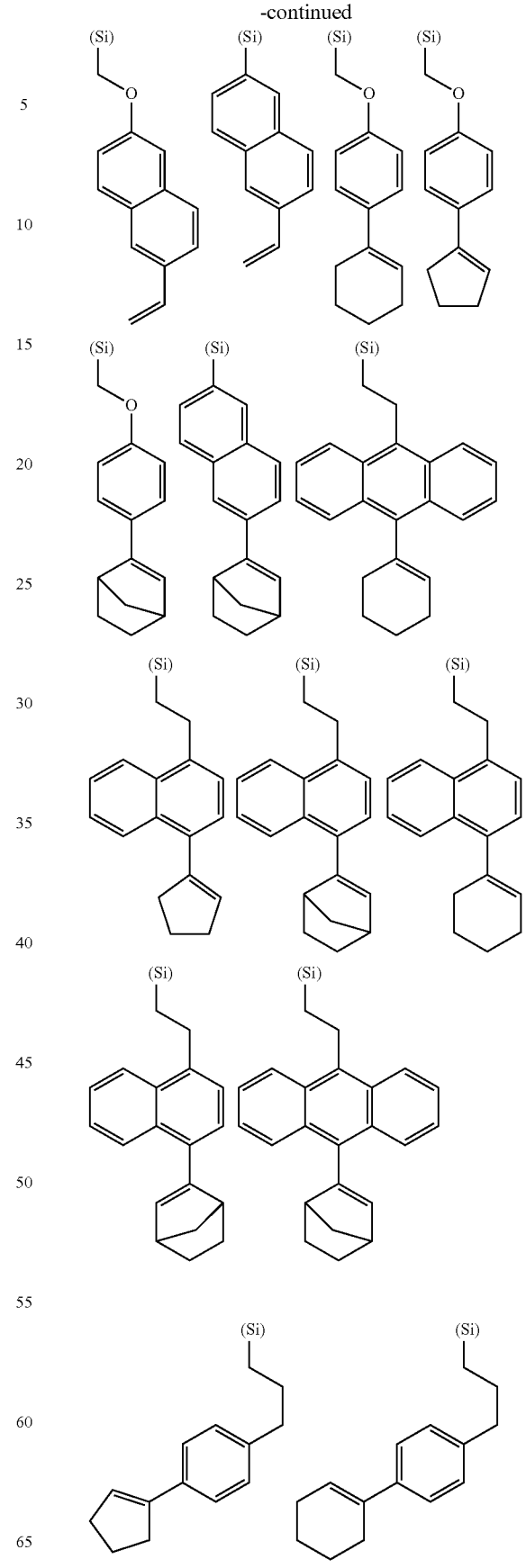

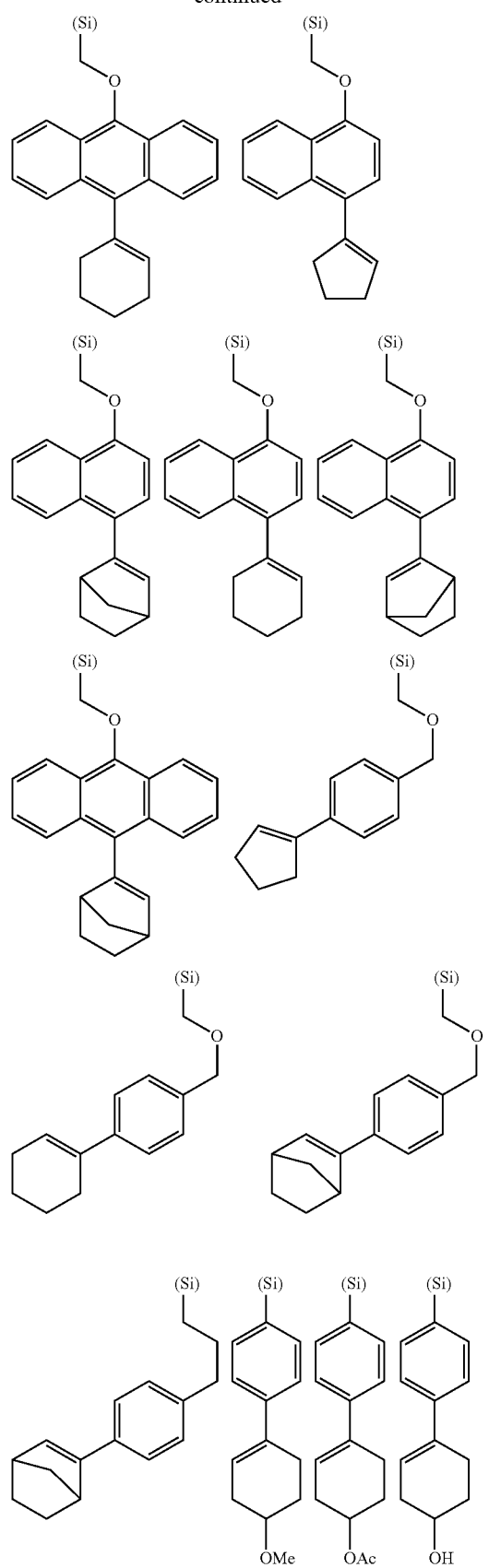
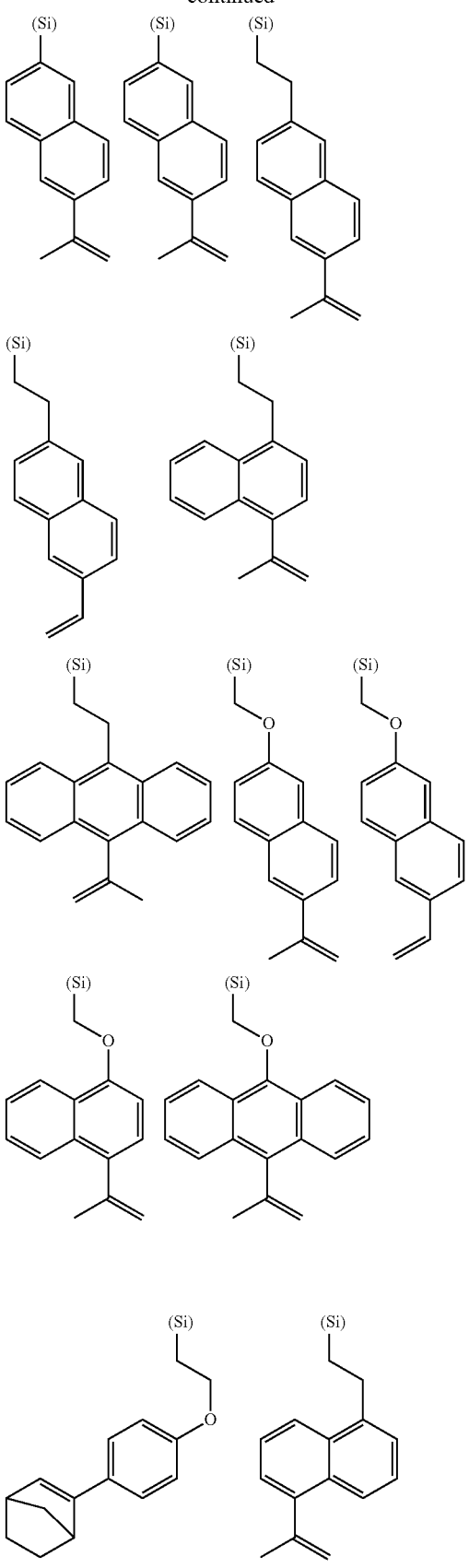

35
-continued
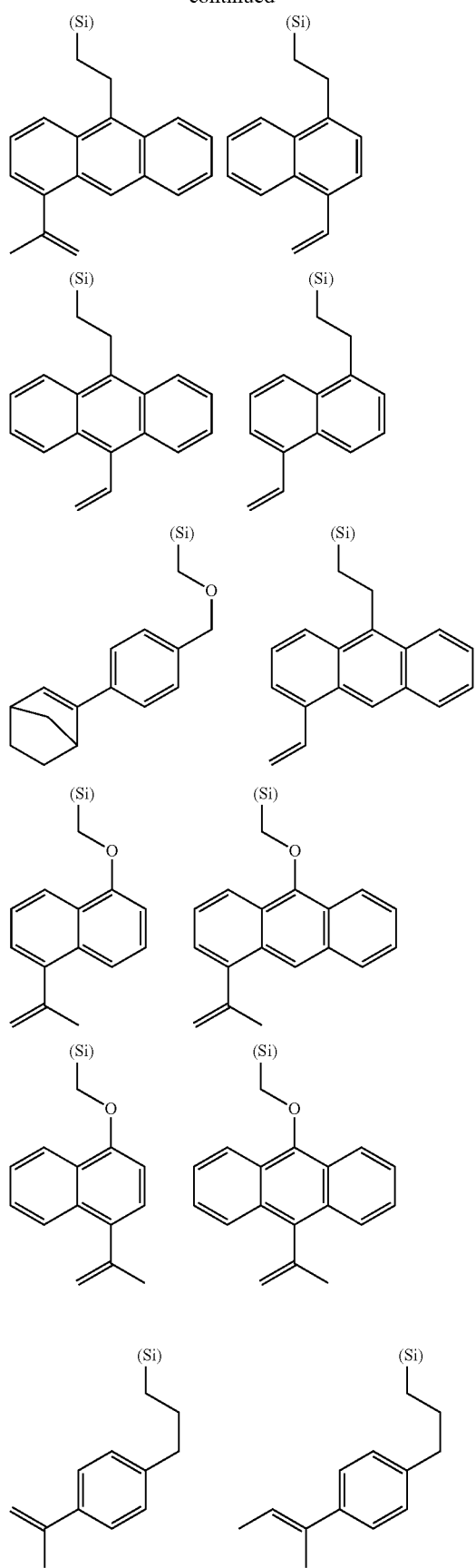
36
-continued
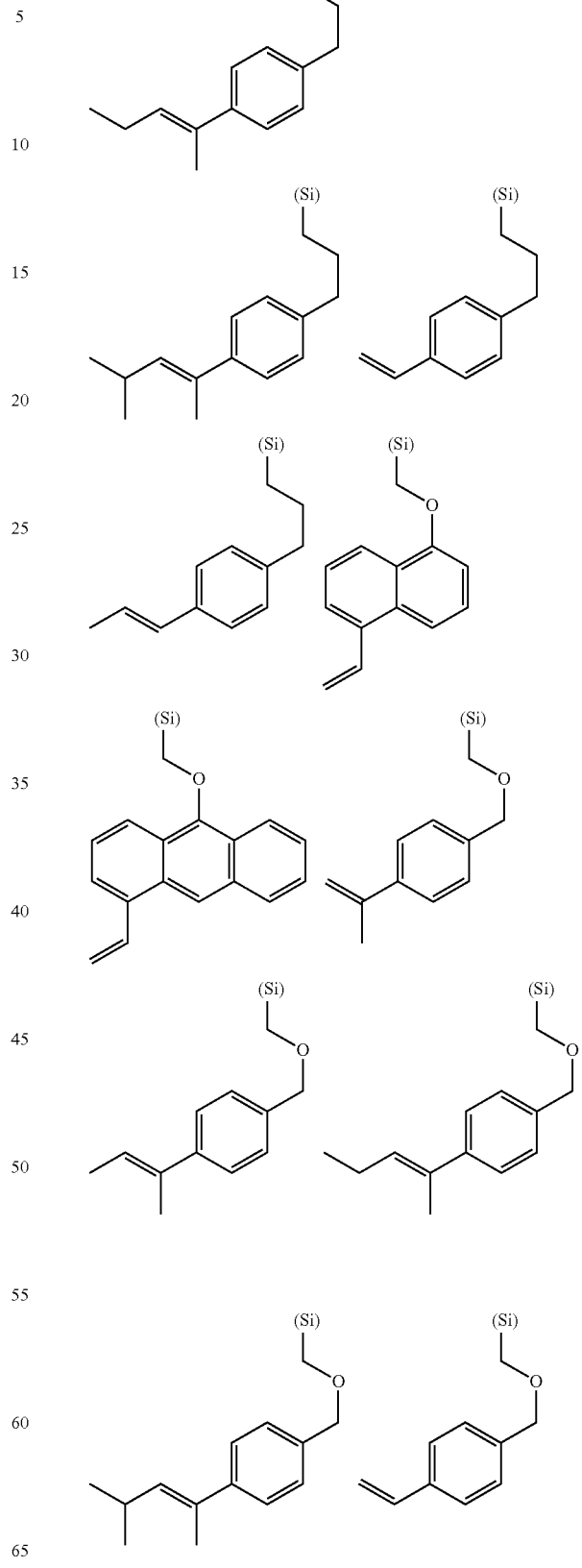

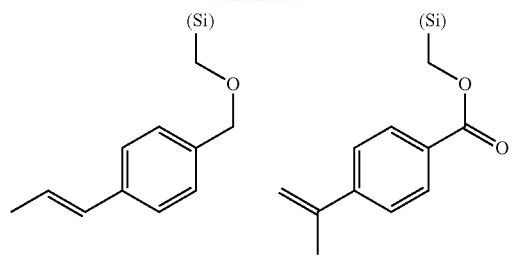
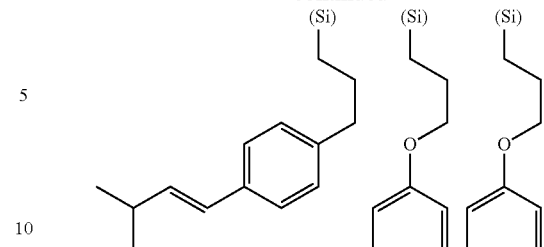
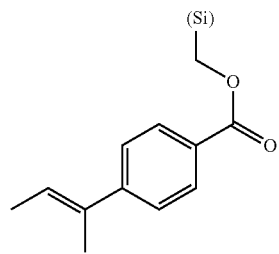
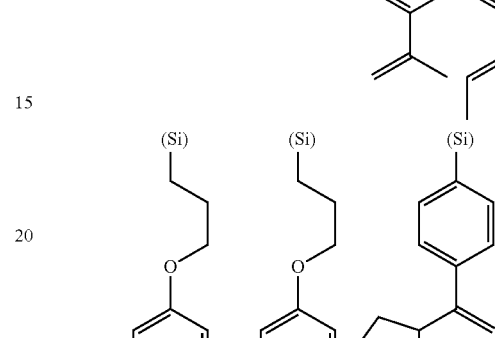
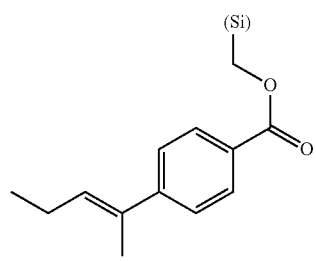
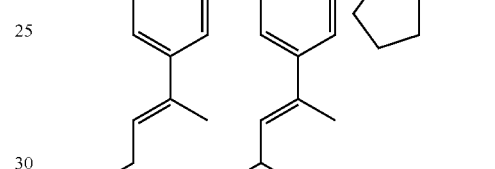
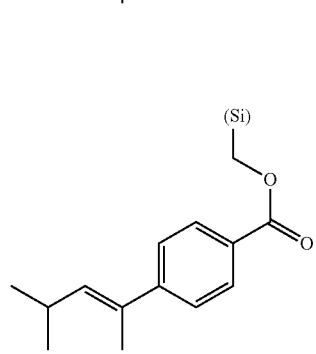
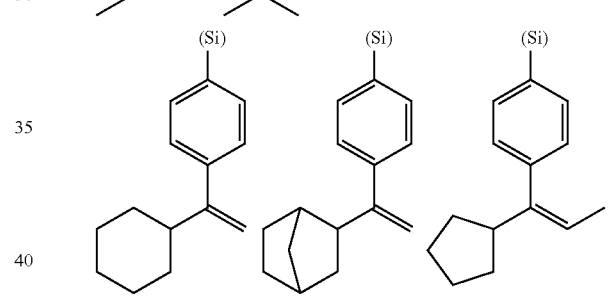
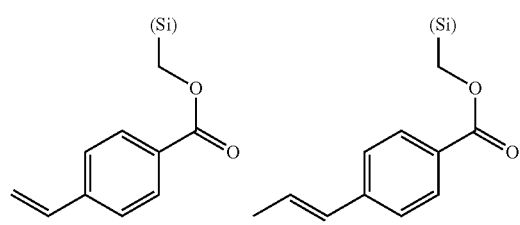
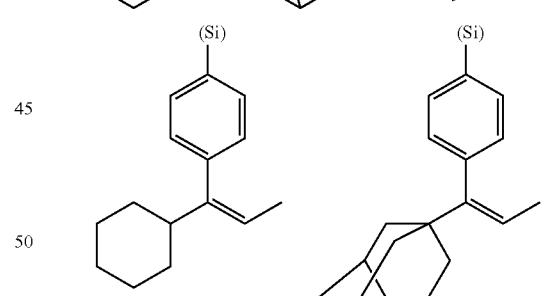
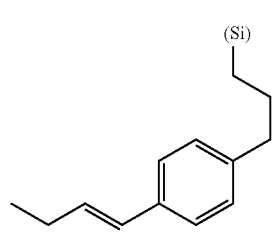
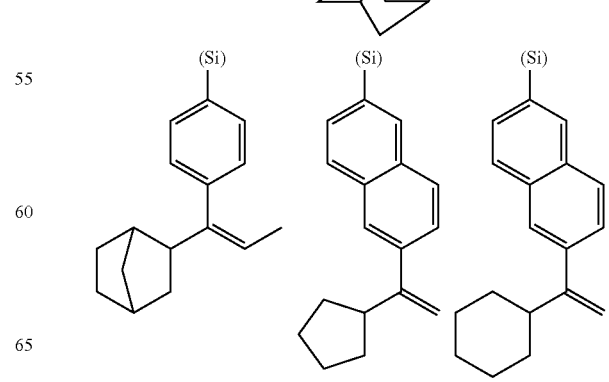

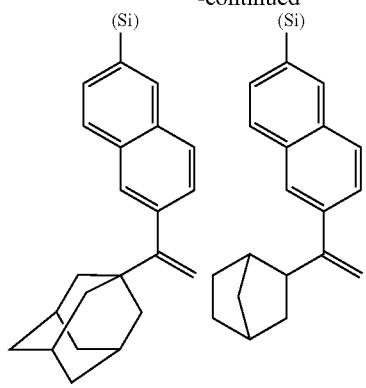
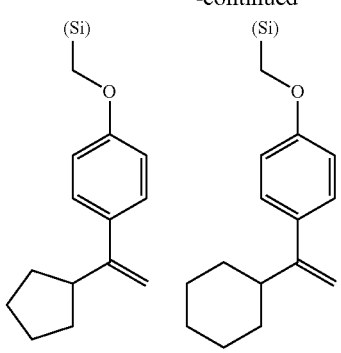
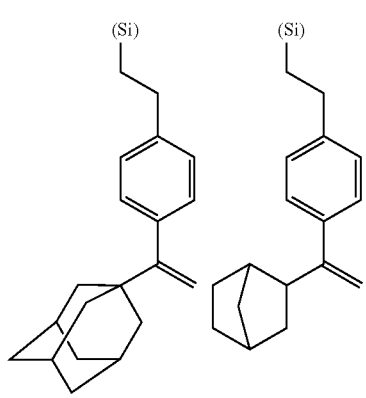
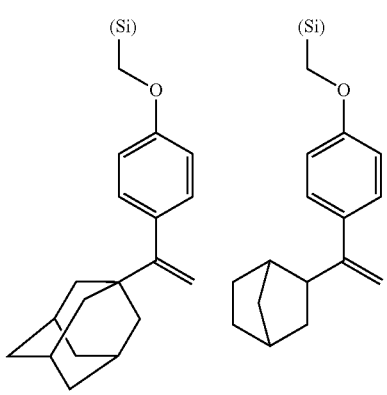
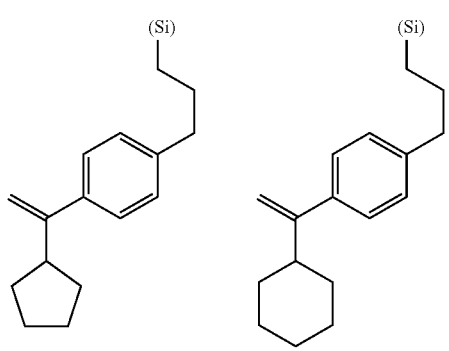
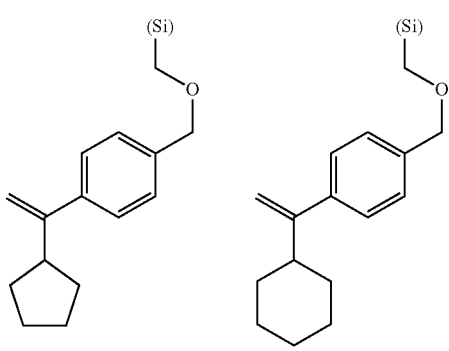
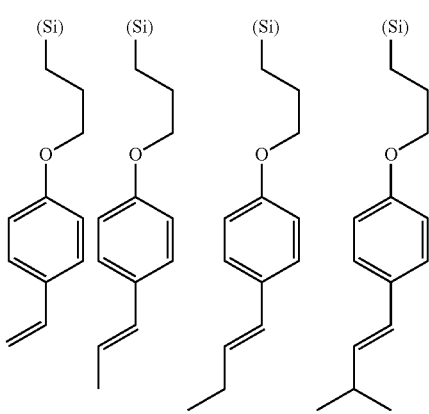

-continued

In the general formulae (A2) and (A3), $R^2$ and $R^3$ each independently represent the same group as the foregoing $R^1$, a hydrogen atom, or a monovalent organic group having 1 to 30 carbon atoms other than $R^1$. Illustrative examples of the preferable monovalent organic group include a methyl group, an ethyl group, a propyl group, a butyl group, a pentyl group, a hexyl group, a heptyl group, an octyl group, a nonyl group, a decyl group, an undecyl group, a dodecyl group, a vinyl group, a propenyl group, a cyclopropyl group, a cyclobutyl group, a cyclopentyl group, a cyclohexyl group, a cycloheptyl group, a norbornyl group, a glycidoxypropyl group, an aminopropyl group, a chloropropyl group, a phenyl group, a tolyl group, a hydroxyphenyl group, an anisyl group, an ethoxyphenyl group, a butoxyphenyl group, a naphthyl group, and a hydroxynaphthyl group.

The inventive silicon-containing condensate may contain a repeating unit other than the repeating unit shown by the general formula (A1), the repeating unit shown by the general formula (A2), and the repeating unit shown by the general formula (A3).

<Method for Producing Silicon-Containing Condensate>

The inventive silicon-containing condensate can be produced by hydrolysis condensation of hydrolyzable material which contains at least one hydrolyzable monomer selected from a hydrolyzable monomer to give a repeating unit shown by the general formula (A1), a hydrolyzable monomer to give a repeating unit shown by the general formula (A2), and a hydrolyzable monomer to give a repeating unit shown by the general formula (A3) (or a hydrolysate or a hydrolysis condensate thereof) by using material which shows acidity or basicity in water as a catalyst.

As described above, the inventive silicon-containing condensate may contain a repeating unit other than the repeating unit shown by the general formula (A1), the repeating unit shown by the general formula (A2), and the repeating unit shown by the general formula (A3). In producing such a silicon-containing condensate, the hydrolyzable material to be the raw material may be blended with a hydrolyzable monomer other than the hydrolyzable monomer to give the repeating unit shown by the general formulae (A1), (A2), and (A3). Illustrative examples of such a hydrolyzable monomer include a silane compound such as tetraalkoxysilane, trialkoxysilane, dialkoxysilane, and monoalkoxysilane exemplified below.

Illustrative examples of the tetraalkoxysilane include tetramethoxysilane, tetraethoxysilane, tetrapropoxysilane, tetraisopropoxysilane.

Illustrative examples of the trialkoxysilane include trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, tert-butyltrimethoxysilane, tert-butyltriethoxysilane, tert-butyltripropoxysilane, tert-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyl trimethoxysilane, cyclohexenylethyl triethoxysilane, cyclohexenylethyl tripropoxysilane, cyclohexenylethyl triisopropoxysilane, cyclooctyltrimethoxysilane, cyclooctyltriethoxysilane, cyclooctyltripropoxysilane, cyclooctyltriisopropoxysilane, cyclopentadienylpropyl trimethoxysilane, cyclopentadienylpropyl triethoxysilane, cyclopentadienylpropyl tripropoxysilane, cyclopentadienylpropyl triisopropoxysilane, bicycloheptenyl trimethoxysilane, bicycloheptenyl triethoxysilane, bicycloheptenyl tripropoxysilane, bicycloheptenyl triisopropoxysilane, bicycloheptyl trimethoxysilane, bicycloheptyl triethoxysilane, bicycloheptyl tripropoxysilane, bicycloheptyl triisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyitriisopropoxysilane, benzyltrimethoxysilane, benzyltriethoxysilane, benzyltripropoxysilane, benzyltriisopropoxysilane, tolyltrimethoxysilane, tolyitriethoxysilane, tolyltripropoxysilane, tolyltriisopropoxysilane, anisyltrimethoxysilane, anisyltriethoxysilane, anisyltripropoxysilane, anisyltriisopropoxysilane, phenethyltrimethoxysilane, phenethyltriethoxysilane, phenethyltripropoxysilane, phenethyltriisopropoxysilane, benzoyloxymethyl trimethoxysilane, benzoyloxyethyl trimethoxysilane, benzoyloxypropyl trimethoxysilane, benzoyloxymethyl triethoxysilane, benzoyloxyethyl triethoxysilane, benzoyloxypropyl triethoxysilane, benzoyloxymethyl tripropoxysilane, benzoyloxyethyl tripropoxysilane, benzoyloxypropyl tripropoxysilane, phenylacetoxymethyl trimethoxysilane, phenylacetoxyethyl trimethoxysilane, phenylacetoxypropyl trimethoxysilane, phenylacetoxymethyl triethoxysilane, phenylacetoxyethyl triethoxysilane, phenylacetoxypropyl triethoxysilane, phenylacetoxymethyl tripropoxysilane, phenylacetoxyethyl tripropoxysilane, phenylacetoxypropyl tripropoxysilane, toluylacetoxymethyl trimethoxysilane, toluylacetoxyethyl trimethoxysilane, toluylacetoxypropyl trimethoxysilane, toluylacetoxymethyl triethoxysilane, toluylacetoxyethyl triethoxysilane, toluylacetoxypropyl triethoxysilane, toluylacetoxymethyl tripropoxysilane, toluylacetoxyethyl tripropoxysilane, toluylacetoxypropyl tripropoxysilane, hydrocinnamoyloxymethyl trimethoxysilane, hydrocinnamoyloxyethyl trimethoxysilane, hydrocinnamoyloxypropyl trimethoxysilane, hydrocinnamoyloxymethyl triethoxysilane, hydrocinnamoyloxyethyl triethoxysilane, hydrocinnamoyloxypropyl triethoxysilane, hydrocinnamoyloxymethyl tripropoxysilane, hydrocinnamoyloxyethyl tripropoxysilane, hydrocinnamoyloxypropyl tripropoxysilane, 2-phenylpropionyloxymethyl trimethoxysilane, 2-phenylpropionyloxyethyl trimethoxysilane, 2-phenylpropionyloxypropyl trimethoxysilane, 2-phenylpropionyloxymethyl triethoxysilane, 2-phenylpropionyloxyethyl triethoxysilane, 2-phenylpropionyloxypropyl triethoxysilane, 2-phenylpropionyloxymethyl tripropoxysilane, 2-phenylpropionyloxyethyl tripropoxysilane, 2-phenylpropionyloxypropyl tripropoxysilane, naphthyltrimethoxysilane, haphthyltriethoxysilane, naphthyltripropoxysilane, naphthyltriisopropoxysilane.

Illustrative examples of the dialkoxysilane include dimethyldimethoxysilane, dimethyidiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyidipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-tert-butyldimethoxysilane, di-tert-butyldiethoxysilane, di-tert-butyldipropoxysilane, di-tert-butyldiisopropoxysilane, dicyclopropyldimethoxysilane, dicyclopropyldiethoxysilane, dicyclopropyldipropoxysilane, dicyclopropyldiisopropoxysilane, dicyclobutyidimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyl dimethoxysilane, dicyclohexenylethyl diethoxysilane, dicyclohexenylethyl dipropoxysilane, dicyclohexenylethyl diisopropoxysilane, dicyclooctyldimethoxysilane, dicyclooctyldiethoxysilane, dicyclooctyldipropoxysilane, dicyclooctyldiisopropoxysilane, dicyclopentadienylpropyl dimethoxysilane, dicyclopentadienylpropyl diethoxysilane, dicyclopentadienylpropyl dipropoxysilane, dicyclopentadienylpropyl diisopropoxysilane, bis(bicycloheptenyl)dimethoxysilane, bis(bicycloheptenyl)diethoxysilane, bis(bicycloheptenyl)dipropoxysilane, bis(bicycloheptenyl) diisopropoxysilane, bis(bicycloheptyl)dimethoxysilane, bis(bicycloheptyl)diethoxysilane, bis(bicycloheptyl) dipropoxysilane, bis(bicycloheptyl)diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane.

Illustrative examples of the monoalkoxysilane include trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Among them, preferable examples include tetramethoxysilane, tetraethoxysilane, tetrapropoxysilane, tetraisopropoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, tolyltrimethoxysilane, tolyltriethoxysilane, anisyltrimethoxysilane, anisyltriethoxysilane, phenethyltrimethoxysilane, phenethyltriethoxysilane, phenylacetoxymethyl trimethoxysilane, phenylacetoxymethyl triethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, and dimethylphenethylmethoxysilane.

(Synthesis Method 1: Acidic Catalyst)

The silicon-containing condensate of the present invention can be produced by hydrolysis condensation of the foregoing hydrolyzable materials, using an acidic catalyst of one or more compounds selected from an inorganic acid, an organic carboxylic acid, an organic sulfonic acid, a carboxylic acid obtained by substituting one or more hydrogen atoms contained in the organic group with fluorine, and a sulfonic acid obtained by substituting one or more hydrogen atoms contained in the organic group with fluorine.

Illustrative examples of the acidic catalyst used in this case include hydrofluoric acid, hydrochloric acid, hydrobromic acid, sulfuric acid, nitric acid, perchloric acid, phosphoric acid, formic acid, acetic acid, oxalic acid, maleic acid, citric acid, trifluoroacetic acid, methanesulfonic acid, trifluoromethanesulfonic acid, benzenesulfonic acid, toluenesulfonic acid, and benzoic acid. The amount of the catalyst to be used is preferably $1 \times 10^{-6}$ to 10 mol, more preferably $1 \times 10^{-5}$ to 5 mol, much more preferably $1 \times 10^{-4}$ to 1 mol per 1 mol of the hydrolyzable material.

The amount of water to be added for obtaining a silicon-containing condensate by hydrolysis condensation of these hydrolyzable materials is preferably in the range of 0.01 to 100 mol, more preferably 0.05 to 50 mol, much more preferably 0.1 to 30 mol per 1 mol of the hydrolyzable substituent bonded to the hydrolyzable material. If the amount is 100 mol or less, a reaction device can be made small, resulting in economical.

In operation, for example, hydrolyzable material is added to an aqueous catalyst solution to start hydrolysis condensation reaction. In this case, organic solvent may be added to the aqueous catalyst solution, or hydrolyzable material may be diluted with the organic solvent, or both may be performed. The reaction temperature is preferably in the range of 0 to 100° C., more preferably 5 to 80° C. Preferable method is to maintain the reaction temperature in the range of 5 to 80° C. when the hydrolyzable materials are dropped, and then age the mixture at 20 to 80° C.

Preferable examples of the organic solvent that can be added to the aqueous catalyst solution or can dilute hydrolyzable materials include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, 3-hydroxy-3-methyl-2-butanone, 3-acetyl-1-propanol, diacetone alcohol, ethyl lactate, 3-pentanol, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, and mixture thereof.

Among them, water-soluble solvent is particularly preferable, and illustrative examples thereof include alcohols such as methanol, ethanol, 1-propanol, and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone; acetonitrile; tetrahydrofuran, etc. Particularly preferable is a solvent with a boiling point of 100° C. or less.

The amount of the organic solvent to be used is preferably in the range of 0 to 1,000 mL, and particularly preferably 0 to 500 mL, per 1 mol of the hydrolyzable material. Smaller amount of the organic solvent is more economical because a reaction device can be made small.

Then, if necessary, neutralization reaction of the catalyst is carried out to obtain an aqueous solution of reaction mixture. The amount of an alkaline substance to be used for neutralization is preferably 0.1 to 2 equivalent, relative to the acid used as the catalyst. The alkaline substance may be any substance so long as it shows basicity in water.

Subsequently, it is preferable to remove, from the reaction mixture, by-products such as alcohol produced due to hydrolysis condensation reaction by a procedure such as removal under reduced pressure. The temperature for heating the reaction mixture is preferably in the range of 0 to 100° C., more preferably 10 to 90° C., much more preferably 15 to 80° C., though it is depending on the kinds of the added organic solvent and an alcohol produced by the reaction. Degree of vacuum is preferably atmospheric pressure or less, more preferably 80 kPa or less in the absolute pressure, much more preferably 50 kPa or less in the absolute pressure, though it is depending on the kinds of the organic solvent and an alcohol to be removed, an exhausting equipment, and a condensation equipment, as well as heating temperature. In this case, although it is difficult to exactly examine the amount of the alcohol to be removed, it is preferable that about 80% by mass or more of a produced alcohol and so forth be removed.

Next, the acidic catalyst used in hydrolysis condensation reaction may be removed from the reaction mixture. For removing the acidic catalyst, there may be mentioned a method in which water is mixed with the reaction mixture which contains a silicon-containing condensate, and the silicon-containing condensate is extracted by an organic solvent. The organic solvent to be preferably used is the one that can dissolve the silicon-containing condensate, and particularly the one that can achieve two-layer separation by mixing with water. Illustrative examples thereof include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, methyl isobutyl ketone, cyclopentyl methyl ether, etc., and mixture thereof.

Moreover, mixture of water-soluble organic solvent and slightly water-soluble organic solvent can also be used. Preferable examples thereof include methanol+ethyl acetate mixture, ethanol+ethyl acetate mixture, 1-propanol+ethyl acetate mixture, 2-propanol+ethyl acetate mixture, butanediol monomethyl ether+ethyl acetate mixture, propylene glycol monomethyl ether+ethyl acetate mixture, ethylene glycol monomethyl ether+ethyl acetate mixture, butanediol monoethyl ether+ethyl acetate mixture, propylene glycol monoethyl ether+ethyl acetate mixture, ethylene glycol monoethyl ether+ethyl acetate mixture, butanediol monopropyl ether+ethyl acetate mixture, propylene glycol monopropyl ether+ethyl acetate mixture, ethylene glycol monopropyl ether+ethyl acetate mixture, methanol+methyl isobutyl ketone mixture, ethanol+methyl isobutyl ketone mixture, 1-propanol+methyl isobutyl ketone mixture, 2-propanol+methyl isobutyl ketone mixture, propylene glycol monomethyl ether+methyl isobutyl ketone mixture, ethylene glycol monomethyl ether+methyl isobutyl ketone mixture, propylene glycol monoethyl ether+methyl isobutyl ketone mixture, ethylene glycol monoethyl ether+methyl isobutyl ketone mixture, propylene glycol monopropyl ether+methyl isobutyl ketone mixture, ethylene glycol monopropyl ether+methyl isobutyl ketone mixture, methanol+cyclopentyl methyl ether mixture, ethanol+cyclopentyl methyl ether mixture, 1-propanol+cyclopentyl methyl ether mixture, 2-propanol+cyclopentyl methyl ether mixture, propylene glycol monomethyl ether+cyclopentyl methyl ether mixture, ethylene glycol monomethyl ether+cyclopentyl methyl ether mixture, propylene glycol monoethyl ether+cyclopentyl methyl ether mixture, ethylene glycol monoethyl ether+cyclopentyl methyl ether mixture, propylene glycol monopropyl ether+cyclopentyl methyl ether mixture, ethylene glycol monopropyl ether+cyclopentyl methyl ether mixture, methanol+propylene glycol methyl ether acetate mixture, ethanol+propylene glycol methyl ether acetate mixture, 1-propanol+propylene glycol methyl ether acetate mixture, 2-propanol+propylene glycol methyl ether acetate mixture, propylene glycol monomethyl ether+propylene glycol methyl ether acetate mixture, ethylene glycol monomethyl ether+propylene glycol methyl ether acetate mixture, propylene glycol monoethyl ether+propylene glycol methyl ether acetate mixture, ethylene glycol monoethyl ether+propylene glycol methyl ether acetate mixture, propylene glycol monopropyl ether+propylene glycol methyl ether acetate mixture, ethylene glycol monopropyl ether+propylene glycol methyl ether acetate mixture, etc., but are not restricted to combination of these mixtures.

The mixing ratio of the water-soluble organic solvent and the slightly water-soluble organic solvent is appropriately determined. The amount of the water-soluble organic solvent is preferably in the range of 0.1 to 1,000 parts by mass, more preferably 1 to 500 parts by mass, much more preferably 2 to 100 parts by mass, based on 100 parts by mass of the slightly water-soluble organic solvent.

Subsequently, the reaction mixture may be washed with neutral water. The neutral water may be water called deionized water or ultrapure water. The amount of the water is preferably in the range of 0.01 to 100 L, more preferably 0.05 to 50 L, much more preferably 0.1 to 5 L per 1 L of the silicon-containing condensate solution. The washing may be performed by putting both the reaction mixture and water into the same container, stirring them, and then leaving to stand to separate a water layer. The number of washing may be 1 time or more, and preferably about 1 to 5 times because washing of 10 times or more is not worth to have full effects thereof.

Other methods for removing the acidic catalyst include a method using an ion-exchange resin and a method for removing the acidic catalyst after neutralization with an epoxy compound such as ethylene oxide and propylene oxide. These methods can be appropriately selected depending on the acidic catalyst used in the reaction.

In this water-washing operation, the number of washing and the amount of water for washing may be appropriately determined in view of effects of catalyst removal and fractionation because there is a case that a part of the silicon-containing condensate escapes into a water layer, thereby substantially the same effect as fractionation operation is obtained.

A final solvent is then added to the silicon-containing condensate solution in either case that the acidic catalyst remains therein or has been removed therefrom, and solvent-exchange is performed under reduced pressure to obtain a desired silicon-containing condensate solution. The temperature during the solvent-exchange is preferably in the range of 0 to 100° C., more preferably 10 to 90° C., much more preferably 15 to 80° C. though it is depending on the kinds of the reaction solvent and the extraction solvent to be removed. Degree of vacuum in this operation is preferably atmospheric pressure or less, more preferably 80 kPa or less in the absolute pressure, much more preferably 50 kPa or less in the absolute pressure though it is depending on the kinds of the extraction solvents to be removed, an exhausting equipment, condensation equipment, and heating temperature.

In this operation, sometimes the silicon-containing condensate may become unstable by solvent-exchange. This occurs due to incompatibility of the silicon-containing condensate with the final solvent. Thus, in order to prevent this problem, a monohydric, dihydric, or more polyhydric alcohol having a cyclic ether substituent, described in paragraphs (0181) to (0182) of Japanese Patent Laid-Open Publication No. 2009-126940 may be added thereto as a stabilizer. The adding amount thereof is preferably in the range of 0 to 25 parts by mass, more preferably 0 to 15 parts by mass, much more preferably 0 to 5 parts by mass, or 0.5 parts by mass or more when it is added, based on 100 parts by mass of the silicon-containing condensate contained in the solution before the solvent-exchange. If necessary, a monohydric, dihydric, or more polyhydric alcohol having a cyclic ether substituent may be added to the solution before the solvent-exchange operation.

There is a fear that condensation reaction of the silicon-containing condensate further progresses when it is concentrated above a certain concentration level, thereby becoming insoluble into an organic solvent. Thus, it is desirable to maintain the solution state with a proper concentration. If the concentration thereof is too dilute, the amount of the solvent becomes excessively large; and thus, the solution state with a proper concentration is desirable in view of economy. Preferable concentration at this time is 0.1 to 50% by mass.

Preferable final solvent added to the silicon-containing condensate solution is a solvent having a hydroxy group, particularly a monoalkyl ether derivative of ethylene glycol, diethylene glycol, triethylene glycol, propylene glycol, dipropylene glycol, butanediol, etc. Illustrative examples thereof include butanediol monomethyl ether; propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, 3-hydroxy-3-methyl-2-butanone, 3-acetyl-1-propanol, diacetone alcohol, ethyl lactate, 3-pentanol, 4-methyl-2-pentanol, etc.

In addition, if these solvents are used as a main solvent, a solvent having no hydroxy group may be added thereinto as an adjuvant solvent. Illustrative examples of this adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, methyl isobutyl ketone, cyclopentyl methyl ether, etc.

As an alternative operation using an acidic catalyst, illustrative example includes a method in which water or a water-containing organic solvent is added to the hydrolyzable materials or an organic solution of the hydrolyzable materials to start hydrolysis reaction. In this operation, the catalyst may be added to the hydrolyzable materials or the organic solution of the hydrolyzable materials, or may be added to the water or the water-containing organic solvent. The reaction temperature is preferably in the range of 0 to 100° C., and more preferably 10 to 80° C. Preferable method is that the mixture is heated at 10 to 50° C. while adding dropwise water, and then further heated at 20 to 80° C. to age the mixture.

As the organic solvent, water-soluble solvent is preferable, and illustrative examples thereof include methanol, ethanol, 1-propanol, 2-propanol, 1-butanol, 2-butanol, 2-methyl-1-propanol, acetone, tetrahydrofuran, acetonitrile, polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, etc., and a mixture thereof.

The amount of the organic solvent to be used is preferably in the range of 0 to 1,000 mL, and particularly preferably 0 to 500 mL, per 1 mol of the hydrolyzable material. Smaller amount of the organic solvent is more economical because a reaction device can be made small. Subsequently, the obtained reaction mixture may be treated in the same manner as mentioned above to obtain a silicon-containing condensate.

(Synthesis Method 2: Alkaline Catalyst)

In addition, the silicon-containing condensate can be produced by hydrolysis condensation reaction of hydrolyzable materials in the presence of an alkaline catalyst. Illustrative examples of the alkaline catalyst to be used in the reaction include methylamine, ethylamine, propylamine, butylamine, ethylene diamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclononene, diazabicycloundecene, hexamethylene tetramine, aniline, N,N-dimethylaniline, pyridine, N,N-dimethylaminopyridine, pyrrole, piperazine, pyrrolidine, piperidine, picoline, tetramethylammonium hydroxide, corrin hydroxide, tetrapropylammonium hydroxide, tetrabutylammonium hydroxide, ammonia, lithium hydroxide, sodium hydroxide, potassium hydroxide, barium hydroxide, and calcium hydroxide. The amount of the catalyst to be used is preferably $1\times10^6$ to 10 mol, more preferably $1\times10^{-5}$ to 5 mol, much more preferably $1\times10^4$ to 1 mol per 1 mol of the hydrolyzable material.

The amount of water to be added for obtaining a silicon-containing condensate by hydrolysis condensation of these hydrolyzable materials is preferably in the range of 0.1 to 50 mol per 1 mol of the hydrolyzable substituent bonded to the hydrolyzable material. If the amount is 50 mol or less, a reaction device can be made small, resulting in economical.

In operation, for example, the hydrolyzable material is added to an aqueous catalyst solution to start hydrolysis condensation reaction. In this case, organic solvent may be added to the aqueous catalyst solution, or hydrolyzable material may be diluted with the organic solvent, or both may be performed. The reaction temperature is preferably in the range of 0 to 100° C., more preferably 5 to 80° C. Preferable method is to maintain the reaction temperature in the range of 5 to 80° C. when the hydrolyzable materials are dropped, and then age the mixture at 20 to 80° C.

As the organic solvent that can be added to the aqueous alkaline catalyst solution or can dilute the hydrolyzable materials, the same organic solvents as those exemplified as the example that can be added to the acidic aqueous catalyst solution, may be used preferably. The amount of the organic solvent to be used is preferably 0 to 1,000 mL per 1 mol of the hydrolyzable material since the reaction can be performed economically.

Then, if necessary, neutralization reaction of the catalyst is carried out to obtain an aqueous solution of reaction mixture. The amount of an acidic substance to be used for neutralization is preferably 0.1 to 2 equivalent, relative to the alkaline substance used as the catalyst. The acidic substance may be any substance so long as it shows acidity in water.

Subsequently, it is preferable to remove, from the reaction mixture, by-products such as alcohol produced due to hydrolysis condensation by a procedure such as removal under reduced pressure. The temperature for heating the reaction mixture is preferably in the range of 0 to 100° C., more preferably 10 to 90° C., much more preferably 15 to 80° C., though it is depending on the kinds of the added organic solvent and an alcohol produced by the reaction. Degree of vacuum is preferably atmospheric pressure or less, more preferably 80 kPa or less in the absolute pressure, much more preferably 50 kPa or less in the absolute pressure, though it is depending on the kinds of the organic solvent and an alcohol to be removed, an exhausting equipment, and a condensation equipment, as well as heating temperature. In this case, although it is difficult to exactly examine the amount of the alcohol to be removed, it is preferable that about 80% by mass or more of a produced alcohol and so forth be removed.

Then, for removing the alkaline catalyst used in hydrolysis condensation reaction, the silicon-containing condensate is preferably extracted by an organic solvent. As the organic solvent to be used, solvents that can dissolve the silicon-containing condensate and achieve two-layer separation by mixing with water is preferable. Further, a mixture of water-soluble organic solvent and slightly water-soluble organic solvent can also be used.

Illustrative examples of the organic solvent used for removing the alkaline catalyst include the organic solvents and the mixture of water-soluble organic solvent and slightly water-soluble organic solvent used for removing the acidic catalyst as exemplified above.

The mixing ratio of the water-soluble organic solvent and the slightly water-soluble organic solvent is appropriately determined. The amount of the water-soluble organic solvent is preferably in the range of 0.1 to 1,000 parts by mass, more preferably 1 to 500 parts by mass, much more preferably 2 to 100 parts by mass, based on 100 parts by mass of the slightly water-soluble organic solvent.

Subsequently, the reaction mixture may be washed with neutral water. The neutral water may be water called deionized water or ultrapure water. The amount of the water is preferably in the range of 0.01 to 100 L, more preferably 0.05 to 50 L, much more preferably 0.1 to 5 L per 1 L of the silicon-containing condensate solution. The washing may be performed by putting both the reaction mixture and water into the same container, stirring them, and then leaving to stand to separate a water layer. The number of washing may be 1 time or more, and preferably about 1 to 5 times because washing of 10 times or more is not worth to have full effects thereof.

A final solvent is then added to the silicon-containing condensate solution in either case that the alkaline catalyst remains therein or has been removed therefrom, and solvent-exchange is performed under reduced pressure to obtain a desired silicon-containing codensate solution. The temperature during the solvent-exchange is preferably in the range of 0 to 100° C., more preferably 10 to 90° C., much more preferably 15 to 80° C. though it is depending on the kinds of the extraction solvent and the reaction solvent to be removed. Degree of vacuum in this operation is preferably atmospheric pressure or less, more preferably 80 kPa or less in the absolute pressure, much more preferably 50 kPa or less in the absolute pressure though it is depending on the kinds of the extraction solvents to be removed, an exhausting equipment, condensation equipment, and heating temperature.

At this time, a monohydric, dihydric, or more polyhydric alcohol having a cyclic ether substituent may be added as a stabilizer similarly to the case where the acidic catalyst is used. The concentration of the silicon-containing condensate solution may be the same as in the case where the acidic catalyst is used.

Preferable final solvent added to the silicon-containing condensate solution is a solvent having a hydroxy group, and the same solvent may be used as exemplified in the case where the acidic catalyst is used.

As an alternative operation using an alkaline catalyst, water or a water-containing organic solvent may be added to the hydrolyzable materials or an organic solution of the hydrolyzable materials to start hydrolysis reaction. In this operation, the catalyst may be added to the hydrolyzable materials or the organic solution of the hydrolyzable materials, or may be added to the water or the water-containing organic solvent. The reaction temperature is preferably in the range of 0 to 100° C., and more preferably 10 to 80° C. Preferable method is that the mixture is heated at 10 to 50° C. while adding dropwise water, and then further heated at 20 to 80° C. to age the mixture.

As the organic solvent, water-soluble solvent is preferable, and illustrative examples thereof include methanol, ethanol, 1-propanol, 2-propanol, 1-butanol, 2-butanol, 2-methyl-1-propanol, acetone, tetrahydrofuran, acetonitrile, polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, etc., and a mixture thereof.

The amount of the organic solvent to be used is preferably in the range of 0 to 1,000 mL, and particularly preferably 0 to 500 mL, per 1 mol of the hydrolyzable material. Smaller amount of the organic solvent is more economical because a reaction device can be made small. Subsequently, the obtained reaction mixture may be treated in the same manner as mentioned above to obtain a silicon-containing condensate.

The molecular weight of the silicon-containing condensate obtained by the above synthesis method 1 or 2 can be adjusted not only by selecting hydrolyzable materials, but also controlling reaction conditions during condensation. The molecular weight of the obtained silicon-containing condensate is not particularly restricted, but the weight average molecular weight is preferably 100,000 or less, more preferably in the range of 200 to 50,000, and much more preferably 300 to 30,000. If the weight average molecular weight is 100,000 or less, generation of foreign matters and coating spots can be suppressed. Meanwhile, the above weight average molecular weight is obtained as data, in terms of polystyrene by means of gel-permeation chromatography (GPC) using polystyrene as a reference material, refractive index (RI) detector as a detector, and tetrahydrofuran as an eluent.

The above described inventive silicon-containing condensate can give a composition for forming a silicon-containing resist under layer film which can form a resist under layer film with improved adhesiveness to any resist pattern, whether the pattern is formed by negative development or positive development.

<Composition for Forming a Silicon-Containing Resist Under Layer Film>

The present invention provides a composition for forming a silicon-containing resist under layer film that contains (A) the inventive silicon-containing condensate described above and (B) a polysiloxane compound other than the component (A). Hereinafter, each component will be specifically described.

[Component (A)]

The component (A) is the foregoing inventive silicon-containing condensate, and the specifics are as described above.

[Component (B)]

The component (B) is a polysiloxane compound other than the component (A). The component (B) can be produced from a hydrolyzable silane compound as a raw material by the same production method as in the silicon-containing condensate. Illustrative examples of the hydrolyzable silane compound to be a raw material include the same tetraalkoxysilane, trialkoxysilane, dialkoxysilane, and monoalkoxysilane as exemplified as a hydrolyzable monomer other than the hydrolyzable monomers to obtain the repeating units shown by the general formulae (A1), (A2), and (A3) in the method for producing the silicon-containing condensate.

The molecular weight of the component (B) is not particularly restricted, but the weight average molecular weight is preferably 100,000 or less, more preferably in the range of 200 to 50,000, and much more preferably 300 to 30,000. If the weight average molecular weight is 100,000 or less, generation of foreign matters and coating spots can be suppressed.

It is preferred that the polysiloxane compound of the component (B) contain a repeating unit derived from a tetrafunctional hydrolyzable monomer, in a ratio of 50 mol % or more of all the repeating unit in the polysiloxane compound. Meanwhile, the foregoing tetra alkoxy silane such as tetramethoxy silane, tetraethoxy silane, tetrapropoxy silane, tetraisopropoxy silane correspond to the tetrafunctional hydrolyzable monomer.

It is also preferred that a mass ratio between the component (A) and the component (B) be (B)≥(A). By using the inventive silicon-containing condensate with an appropriate mass ratio and with an appropriate compound, it is possible to obtain a composition capable of forming a resist under layer film having not only excellent etching selectivity and pattern adhesiveness but also patterning properties stable in both negative development and positive development.

[Other Components]

(Thermal Crosslinking Accelerator)

In the present invention, a thermal crosslinking accelerator may be blended to the composition for forming a silicon-containing resist under layer film, if necessary. As the blendable thermal crosslinking accelerator, there may be mentioned compounds shown by the general formula (C) or (D), $$L_a H_b X \qquad (C)$$

wherein L represents lithium, sodium, potassium, rubidium, or cesium; X represents a hydroxy group or a monovalent, divalent, or more polyvalent organic acid group having 1 to 30 carbon atoms; "a" represents an integer of 1 or more, "b" represents 0 or an integer of 1 or more, and a+b represents a valency of the hydroxy group or the organic acid group, $$MY \qquad (D)$$

wherein M represents sulfonium ion, iodonium ion, phosphonium ion, or ammonium ion; and Y represents a non-nucleophilic counter ion.

Illustrative examples of Y include hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-tert-butylbenzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, chlorate ion, perchlorate ion, bromate ion, iodate ion, oxalate ion, malonate ion, methylmalonate ion, ethylmalonate ion, propylmalonate ion, butylmalonate ion, dimethylmaionate ion, diethylmalonate ion, succinate ion, methylsuccinate ion, glutarate ion, adipate ion, itaconate ion, maleate ion, fumarate ion, citraconate ion, citrate ion, carbonate ion, methanesulfonate ion, sulfate ion, hydrogen sulfate ion, methyl sulfate ion, benzenesulfonate ion, toluenesulfonate ion, and tetraphenylborate ion.

Illustrative examples of the compound shown by the general formula (C) or (D) are described in Japanese Patent Laid-Open Publication No. 2010-262230 and No. 2014-141585.

The thermal crosslinking accelerators can be used solely or in combination of two or more kinds. The adding amount of the thermal crosslinking accelerator is preferably 0.01 to 50 parts by mass, more preferably 0.1 to 40 parts by mass, based on 100 parts by mass of the total of the component (A) and the component (B).

(Organic Acid)

To improve stability of the composition for forming a silicon-containing resist under layer film of the present invention, a monovalent, divalent, or more polyvalent organic acid having 1 to 30 carbon atoms is preferably added. Examples of the acid to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Especially, oxalic acid, maleic acid, formic acid, acetic acid, propionic acid, citric acid, etc., are preferable. Moreover, two or more organic acids may be used to keep stability. The adding amount thereof is preferably 0.001 to 25 parts by mass, more preferably 0.01 to 15 parts by mass, much more preferably 0.1 to 5 parts by mass, based on 100 parts by mass of silicon atoms contained in the composition.

Otherwise, the organic acid is preferably added such that pH of the composition satisfies $0 \leq pH \leq 7$, more preferably $0.3 \leq pH \leq 6.5$, much more preferably $0.5 \leq pH \leq 6$.

(Water)

Into the inventive composition for forming a silicon-containing resist under layer film, water may be added, if necessary. When water is added, the silicon-containing condensate is hydrated, so that lithography performance is improved. The content of water in the solvent component of the composition is preferably more than 0% by mass and less than 50% by mass, more preferably 0.3 to 30% by mass, much more preferably 0.5 to 20% by mass. If the amount is in such a range, uniformity of a silicon-containing resist under layer film becomes excellent, and eye holes can be suppressed. In addition, lithography performance is improved.

The amount of the total solvent including water is preferably 100 to 100,000 parts by mass, particularly 200 to 50,000 parts by mass, based on 100 parts by mass of the total of the component (A) and the component (B).

(Photo-Acid Generator)

Into the inventive composition for forming a silicon-containing resist under layer film, a photo-acid generator may be added, if necessary. Illustrative examples of the photo-acid generator to be added include a material described in paragraphs (0160) to (0179) of Japanese Patent Laid-Open Publication No. 2009-126940.

(Stabilizer)

Further, into the inventive composition for forming a silicon-containing resist under layer film, a stabilizer may be added, if necessary. As the stabilizer, a monohydric, dihydric, or more polyhydric alcohol having a cyclic ether substituent may be added. In particular, a stabilizer described in paragraphs (0181) to (0182) of Japanese Patent Laid-Open Publication No. 2009-126940 is preferable since stability of the composition for forming a silicon-containing resist under layer film can be improved.

(Surfactant)

Furthermore, a surfactant may be added to the inventive composition for forming a silicon-containing resist under layer film, if necessary. Illustrative examples of the surfactant include materials described in paragraph (0185) of Japanese Patent Laid-Open Publication No. 2009-126940.

The above described inventive composition for forming a silicon-containing resist under layer film can form a resist under layer film with improved adhesiveness to any resist pattern, whether the pattern is formed by negative development or positive development.

<Patterning Process>

The present invention also provides a patterning process comprising: forming an organic film on a body to be processed by using a coating-type organic film material; forming a resist under layer film on the organic film by using the inventive composition for forming a silicon-containing resist under layer film; forming a resist upper layer film on the resist under layer film by using a resist upper layer film material composed of a photoresist composition; forming a circuit pattern in the resist upper layer film; transferring the pattern to the resist under layer film by dry etching using the resist upper layer film having the formed pattern as a mask; transferring the pattern to the organic film by dry etching using the resist under layer film having the transferred pattern as a mask; and transferring the pattern to the body to be processed by dry etching using the organic film having the transferred pattern as a mask.

The present invention further provides a patterning process comprising: forming a hard mask mainly consisting of carbon on a body to be processed by a CVD method; forming a resist under layer film on the CVD hard mask by using the inventive composition for forming a silicon-containing resist under layer film; forming a resist upper layer film on the resist under layer film by using a resist upper layer film material composed of a photoresist composition; forming a circuit pattern in the resist upper layer film; transferring the pattern to the resist under layer film by dry etching using the resist upper layer film having the formed pattern as a mask; transferring the pattern to the CVD hard mask by dry etching using the resist under layer film having the transferred pattern as a mask; and further transferring the pattern to the body to be processed by dry etching using the CVD hard mask having the transferred pattern as a mask.

The body to be processed used in the process may be a semiconductor apparatus substrate or a material in which any of a metal film, a metal carbide film, a metal oxide film, a metal nitride film, a metal oxycarbide film, and a metal oxynitride film is formed as a layer to be processed (a portion to be processed) on the semiconductor apparatus substrate.

As the semiconductor apparatus substrate, a silicon substrate is generally used, but it is not particularly limited thereto; a material such as Si, amorphous silicon (α-Si), p-Si, $SiO_2$, SiN, SiON, W, TiN, Al, and a different material from the layer to be processed may be used.

The metal of the body to be processed may be silicon, titanium, tungsten, hafnium, zirconium, chromium, germanium, copper, aluminum, indium, gallium, arsenic, palladium, iron, tantalum, iridium, molybdenum, or an alloy thereof. The layer to be processed containing such a metal may be made of Si, $SiO_2$, SiN, SiON, SiOC, p-Si, α-Si, TiN, WSi, BPSG, SOG, Cr, CrO, CrON, MoSi, W, Al, Cu, Al—Si, or the like; various low dielectric constant (low-k) films, or etching stopper film thereof. The layer is generally formed with a thickness of 50 to 10,000 nm, particularly 100 to 5,000 nm.

When a coating-type organic film is formed on a body to be processed (under a resist under layer film), it is preferable to use the coating-type organic film material comprising an aromatic ring-containing compound. By using such a material as a coating-type organic film material, an occurrence of pattern collapse can be further suppressed. It is more preferable to use a material comprising a resin which contains a repeating unit having a hydroxy group directly bonded to the aromatic ring.

On the other hand, when a CVD hard mask is formed on a body to be processed (under a resist under layer film), the hard mask mainly composed of carbon may be formed by a CVD method, which can be performed by a well-known method.

A resist under layer film can be formed by applying the inventive composition for forming a silicon-containing resist under layer film on a body to be processed by spin coating, etc. After spin coating, it is desired to bake it to evaporate the solvent, prevent from mixing with a resist upper layer film, and promote the crosslinking reaction. The baking temperature is preferably in the range of 50 to 500° C., and the baking time is preferably in the range of 10 to 300 seconds. Particularly preferable temperature range is 400° C. or less for reducing heat damage to the devices, though it is depending on the structure of the devices to be fabricated.

In the patterning process of the present invention, the material for forming a resist upper layer film is not particularly limited so long as it is a chemical amplified photoresist composition. In the present invention, both of positive development using alkaline developer and negative development using organic solvent developer can be adopted, and it is possible to select a positive type resist upper layer film material or a negative type resist upper layer film material depending on the development method.

For example, if the exposing step in the present invention is carried out by an exposure process using an ArF excimer laser beam, any usual resist composition used for a ArF excimer laser beam can be used as the resist upper layer film material.

As the resist composition for ArF excimer laser beam, many candidates have been well-known. When the well-known resins are roughly classified, there are a poly(meth)acryl type, a COMA (Cycloolefin Maleic Anhydride) type, a COMA-(meth)acrylic hybrid type, a ROMP (Ring Opening Metathesis Polymerization) type, and a polynorbornene type material, etc. Among them, the resist composition using the poly(meth)acryl type resin secures its etching resistance by introducing an alicyclic skeletal structure at the side chain, so that it is excellent in resolution property as compared with the other resin type, therefore it can be preferably used.

In the inventive patterning process, it is preferable to form a circuit pattern in the resist upper layer film by a lithography with a wavelength of 10 nm or more and 300 nm or less, a direct drawing by electron beam, and a nanoimprinting, or a combination thereof. In forming the circuit pattern, it is preferable to develop the circuit pattern by alkaline development or organic solvent development. In the inventive patterning process, such patterning means and development means can be preferably used.

When a circuit pattern formed in a resist upper layer film is transferred to a resist under layer film, an organic film, or a CVD hard mask and a body to be processed by dry etching, the dry etching can be performed by a well-known method.

The above described inventive patterning process can form a fine pattern while suppressing a pattern collapse in both negative development and positive development when the coating-type organic film or a CVD hard mask is formed under the resist under layer film.

EXAMPLES

Hereinafter, the present invention will be specifically described with reference to Synthesis examples, Examples, and Comparative examples, but the present invention is not restricted thereto. In the following examples, % means % by mass. The molecular weight measurement was carried out by GPC. Molecular weight and dispersibility by GPC in terms of polystyrene are described as "Mw" and "Mw/Mn" respectively.

Synthesis of (A) Silicon-containing Condensate

Synthesis Example 1-1

To a mixture of 200 g of methanol, 0.1 g of methanesulfonic acid, and 60 g of deionized water, a mixture of 38.1 g of Monomer [M1-3] and 64.1 g of Monomer [M2-1] were added. This was held at 40° C. for 12 hours to undergo hydrolysis condensation. After the completion of the reaction, 200 g of propylene glycol ethyl ether (PGEE) was added thereto, and the by-product alcohol was distilled off under reduced pressure. Then, 1,000 mL of ethyl acetate and 300 g of PGEE were added thereto, and the water layer was separated. To the remained organic layer, 100 mL of ion-exchange water was added followed by stirring and leaving, and then the water layer was separated. This procedure was repeated for three times. The remained organic layer was concentrated under reduced pressure to obtain a 580 g of PGEE solution of Silicon-containing condensate 1 (the concentration of the compound: 10.6%). The molecular weight of this Silicon-containing condensate 1 was measured in terms of polystyrene to find that Mw=1,510.

Synthesis Examples 1-2 to 1-8

The synthesis of silicon-containing condensate was performed under the same condition as in Synthesis example 1-1, except that the monomers shown in Table 1 were used as the reaction materials to obtain each of Silicon-containing condensates 2 to 8.

TABLE 1

| Synthesis example | Silicon-containing condensate | Reaction materials (monomers) | Mw |
| --- | --- | --- | --- |
| 1-1 | Silicon-containing condensate 1 | [M1-3]: 38.1 g, [M2-1]: 64.1 g | 1,510 |
| 1-2 | Silicon-containing condensate 2 | [M1-2]: 6.8 g, [M1-3]: 30.4 g, [M2-2]: 70.6 g | 1,520 |
| 1-3 | Silicon-containing condensate 3 | [M1-2]: 13.6 g, [M1-3]: 22.8 g, [M2-3]: 67.6 g | 1,500 |

TABLE 1-continued

| Synthesis example | Silicon-containing condensate | Reaction materials (monomers) | Mw |
|---|---|---|---|
| 1-4 | Silicon-containing condensate 4 | [M1-1]: 9.9 g, [M1-2]: 27.2 g, [M2-4]: 80.1 g | 1,490 |
| 1-5 | Silicon-containing condensate 5 | [M1-2]: 34.1 g, [M2-5]: 94.6 g | 1,400 |
| 1-6 | Silicon-containing condensate 6 | [M1-4]: 52.2 g, [M2-6]: 59.6 g | 1,740 |
| 1-7 | Silicon-containing condensate 7 | [M1-4]: 62.6 g, [M2-7]: 50.9 g | 1,510 |
| 1-8 | Silicon-containing condensate 8 | [M1-2]: 6.8 g, [M1-4]: 62.6 g, [M2-8]: 44.5 g | 1,320 |

PhSi (OCH$_3$)$_3$ [M1-1]
CH$_3$Si (OCH$_3$)$_3$ [M1-2]
Si(OCH$_3$)$_4$ [M1-3]
Si(OC$_2$H$_5$)$_4$ [M1-4]

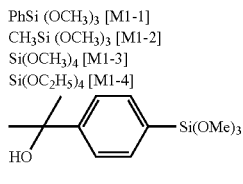

[M2-1]

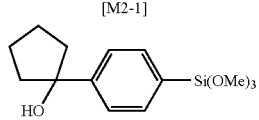

[M2-2]

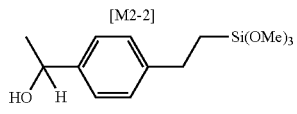

[M2-3]

[M2-4]

[M2-5]

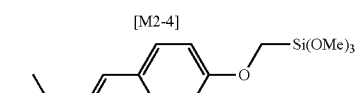

[M2-6]

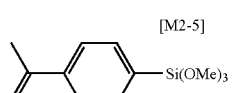

[M2-7]

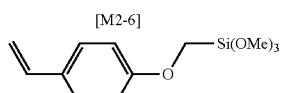

[M2-8]

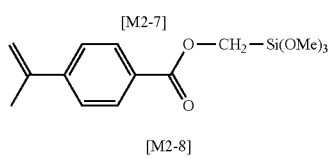

Synthesis of Styrene Type Surface Modifier

Synthesis Example 1-9

Into a 200 mL flask was put 14.6 g of PGEE (propylene glycol monoethyl ether) as a polymerization solvent, and heated at 80° C. under nitrogen atmosphere while stirring. To this, 11.22 g (50.0 mmol) of 4-(trimethoxysilyl)styrene, 8.81 g (50.0 mmol) of 4-tert-butoxystyrene, and as a polymerization initiator, a mixture containing 2.30 g of V601 (manufactured by Wako Pure Chemical Industries, Ltd.) and 29.1 g of PGEE were added at 80° C. over 4 hours. After the solution was stirred at 80° C. for 16 hours, the temperature was decreased to room temperature to obtain 64 g of PGEE solution of Styrene type surface modifier 1 shown by the following structure (the concentration of the compound: 32%). The molecular weight of this Styrene type surface modifier 1 was measured in terms of polystyrene to find that Mw=12,300.

Styrene Type Surface Modifier 1

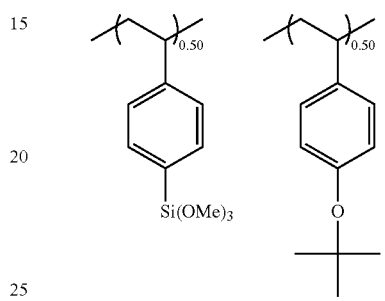

Synthesis of (B) Polysiloxane Compound

Synthesis Example 2-1

To a mixture of 120 g of methanol, 0.1 g of 70% nitric acid, and 60 g of deionized water, a mixture of 5.0 g of monomer [M1-1], 3.4 g of Monomer [M1-2], and 68.5 g of Monomer [M1-3] was added. This was held at 40° C. for 12 hours to undergo hydrolysis condensation. After the completion of the reaction, 300 g of PGEE was added thereto, and the by-product alcohol and excess water were distilled off under reduced pressure to obtain a 320 g of PGEE solution of Polysiloxane 1 (the concentration of the compound: 10%). The molecular weight of this Polysiloxane 1 was measured in terms of polystyrene to find that Mw=2,300.

Synthesis Examples 2-2 and 2-3

Polysiloxane compound was synthesized under the same condition as in Synthesis example 2-1, except that the monomers shown in Table 2 were used as the reaction materials to obtain each of Polysiloxanes 2 and 3.

TABLE 2

| Synthesis example | Polysiloxane | Reaction materials (monomers) | Ratio of tetra-functional monomer | Mw |
|---|---|---|---|---|
| 2-1 | Polysiloxane 1 | [M1-1]: 5.0 g, [M1-2]: 3.4 g, [M1-3]: 68.5 g | 90 mol % | 2,300 |
| 2-2 | Polysiloxane 2 | [M1-1]: 5.0 g, [M1-2]: 17.0 g, [M1-3]: 53.3 g | 70 mol % | 3,200 |
| 2-3 | Polysiloxane 3 | [M1-1]: 5.0 g, [M1-2]: 30.6 g, [M1-3]: 38.1 g | 50 mol % | 2,100 |

Examples and Comparative Examples

[Preparation of Solution of Composition for Forming a Silicon-Containing Resist Under Layer Film]

The Silicon-containing condensates 1 to 8 as the component (A), Styrene type surface modifier 1, Polysiloxanes 1 to 3 as the component (B) each obtained in the foregoing Synthesis examples, thermal crosslinking accelerator, photo-acid generator, acids, solvents, and water were mixed in the ratios shown in Table 3, and the mixtures were filtered through a filter with a pore size of 0.1 μm made of a fluorine resin to prepare solutions of a composition for forming a silicon-containing resist under layer film, which were named Sol. 1 to 22.

TABLE 3

| No. | Surface modifier (parts by mass) | Polysiloxane (parts by mass) | Thermal cross-linking accelerator (parts by mass) | Photo-acid generator (parts by mass) | Acid (parts by mass) | Solvent (parts by mass) | Water (parts by mass) |
|---|---|---|---|---|---|---|---|
| Sol. 1 | Silicon-containing condensate 1 (0.1) | 1 (3.9) | TPSOH (0.04) | None | Maleic acid (0.04) | PGEE (150) | Water (15) |
| Sol. 2 | Silicon-containing condensate 1 (0.1) | 1 (3.9) | TPSNO$_3$ (0.04) | None | Oxalic acid (0.04) | PGEE (150) | Water (15) |
| Sol. 3 | Silicon-containing condensate 1 (0.1) | 1 (3.9) | TPSOx (0.04) | None | Maleic acid (0.04) | PGEE (150) | Water (15) |
| Sol. 4 | Silicon-containing condensate 1 (0.1) | 1 (3.9) | TPSTFA (0.04) | None | Maleic acid (0.04) | PGEE (150) | Water (15) |
| Sol. 5 | Silicon-containing condensate 1 (0.1) | 1 (3.9) | TPSOCOPh (0.04) | None | Oxalic acid (0.04) | PGEE (150) | Water (15) |
| Sol. 6 | Silicon-containing condensate 1 (0.1) | 1 (3.9) | TPSH$_2$PO$_4$ (0.04) | None | Oxalic acid (0.04) | PGEE (150) | Water (15) |
| Sol. 7 | Silicon-containing condensate 1 (0.1) | 1 (3.9) | QMAMA (0.04) | None | Maleic acid (0.04) | PGEE (150) | Water (15) |
| Sol. 8 | Silicon-containing condensate 1 (0.1) | 1 (3.9) | QBANO$_3$ (0.04) | None | Maleic acid (0.04) | PGEE (150) | Water (15) |
| Sol. 9 | Silicon-containing condensate 1 (0.1) | 1 (3.9) | QMATFA (0.04) | TPSNf (0.04) | Maleic acid (0.04) | PGEE (150) | Water (15) |
| Sol. 10 | Silicon-containing condensate 1 (0.1) | 1 (3.9) | Ph$_2$ICl (0.04) | None | Maleic acid (0.04) | PGEE (150) | Water (15) |
| Sol. 11 | Silicon-containing condensate 1 (0.1) | 1 (3.9) | TPSMA (0.04) | None | Maleic acid (0.04) | PGEE (150) | Water (15) |
| Sol. 12 | Silicon-containing condensate 2 (0.1) | 1 (3.9) | TPSMA (0.04) | None | Maleic acid (0.04) | PGEE (150) | Water (15) |
| Sol. 13 | Silicon-containing condensate 3 (0.1) | 1 (3.9) | TPSMA (0.04) | None | Maleic acid (0.04) | PGEE (150) | Water (15) |
| Sol. 14 | Silicon-containing condensate 4 (0.1) | 1 (3.9) | TPSMA (0.04) | None | Maleic acid (0.04) | PGEE (150) | Water (15) |
| Sol. 15 | Silicon-containing condensate 5 (0.1) | 1 (3.9) | TPSMA (0.04) | None | Maleic acid (0.04) | PGEE (165) | None |
| Sol. 16 | Silicon-containing condensate 6 (0.1) | 1 (3.9) | TPSMA (0.04) | None | Oxalic acid (0.04) | PGEE (150) | Water (15) |
| Sol. 17 | Silicon-containing condensate 7 (0.1) | 1 (3.9) | TPSMA (0.04) | None | Maleic acid (0.04) | PGEE (150) | Water (15) |
| Sol. 18 | Silicon-containing condensate 8 (0.1) | 1 (3.9) | TPSMA (0.04) | None | Maleic acid (0.04) | PGEE (150) | Water (15) |
| Sol. 19 | Silicon-containing condensate 1 (0.1) | 2 (3.9) | TPSMA (0.04) | None | Maleic acid (0.04) | PGEE (135) GBL (15) | Water (15) |
| Sol. 20 | Silicon-containing condensate 1 (0.1) | 3 (3.9) | TPSMA (0.04) | None | Maleic acid (0.04) | PGEE (150) | Water (15) |
| Sol. 21 | Silicon-containing condensate 1 (0.05) Styrene type surface modifier (0.05) | 1 (3.9) | TPSMA (0.04) | None | Maleic acid (0.04) | PGEE (150) | Water (15) |
| Sol. 22 | None | 1 (4.0) | TPSMA (0.04) | None | Maleic acid (0.04) | PGEE (150) | Water (15) |

TPSOH: triphenylsulfonium hydroxide
TPSNO$_3$: triphenylsulfonium nitrate
TPSOx: mono(triphenylsulfonium) oxalate
TPSTFA: triphenylsulfonium trifluoroacetate
TPSOCOPh: triphenylsulfonium benzoate
TPSH$_2$PO$_4$: mono(triphenylsulfonium) phosphate
TPSMA: mono(triphenylsulfonium) maleate
TPSNf: triphenylsulfonium nonafluorobutanesulfonate
QMAMA: mono(tetramethylammonium) maleate
QMATFA: tetramethylammonium trifluoroacetate
QBANO$_3$: tetrabuthylammonium nitrate
Ph$_2$ICl: diphenyliodonium chloride
PGEE: propylene glycol ethyl ether
GBL: γ-butyrolactone

[Test by Positive Development Resist]
(Patterning Test: Examples 1-1 to 1-21 and Comparative Example 1-1)

Onto a silicon wafer, a composition of the following naphthalene skeleton-containing resin (UL polymer 1) was applied by spin coating and heated at 350° C. for 60 seconds to form an organic under layer film having a film thickness of 200 nm. Then, the solutions of composition for forming a silicon-containing resist under layer film, Sol. 1 to 22, were each applied thereon by spin coating and heated at 240° C. for 60 seconds to form a silicon-containing resist under layer film, Films 1 to 22, having a film thickness of 35 nm.

Naphthalene skeleton-containing resin: UL polymer 1
Molecular weight (MW): 4,200
Dispersibility (Mw/Mn): 3.35

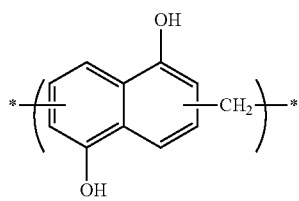

Thereafter, an ArF resist composition solution for positive development (PR-1) shown in Table 4 was applied onto the silicon-containing resist under layer film, and then baked at 110° C. for 60 seconds to form a photoresist film having a film thickness of 100 nm. Furthermore, solution of liquid immersion protective film composition (TC-1) shown in Table 5 was applied onto the photoresist film, and then heated at 90° C. for 60 seconds to form a protective film having a film thickness of 50 nm.

Next, these were exposed by an ArF immersion exposure apparatus (NSR-S610C, manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass aqueous tetramethylammonium hydroxide (TMAH) solution for 30 seconds to obtain 42 nm 1:1 positive line and space pattern. Then, pattern collapse after development was observed with an electron microscope (CG4000) manufactured by Hitachi High-Technologies Corporation, and cross-sectional shape was observed with an electron microscope (S-9380) manufactured by Hitachi, Ltd. The results are shown in Table 6.

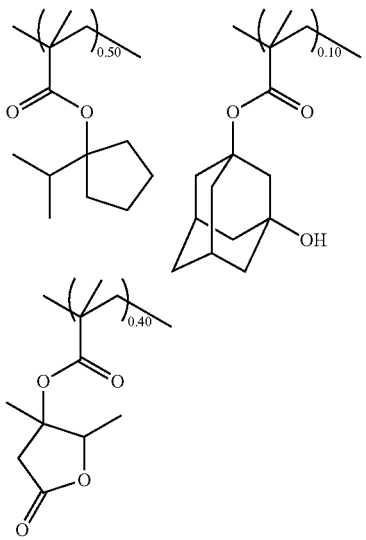

Acid generator: PAG1

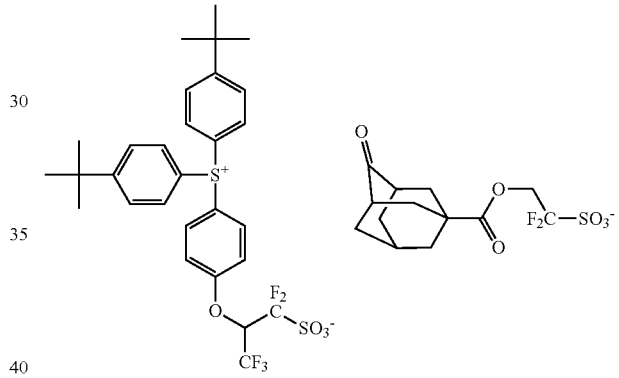

Base: Q1

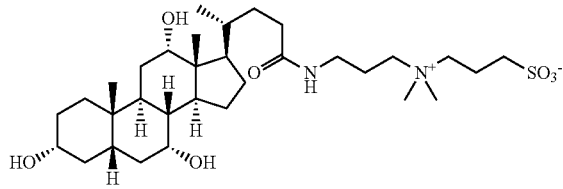

TABLE 4

| No. | ArF resist polymer (parts by mass) | Acid generator (parts by mass) | Base (parts by mass) | Water repellency polymer (parts by mass) | Solvent (parts by mass) |
|---|---|---|---|---|---|
| PR-1 | P1 (100) | PAG1 (10.0) | Q1 (4.25) | FP1 (4.0) | PGMEA (2,200) GBL (300) |

PGMEA: propylene glycol monomethyl ether acetate

ArF resist polymer: P1
Molecular weight (Mw)=11,300
Dispersibility (Mw/Mn)=1.89

Water repellency polymer: FP1
Molecular weight (Mw)=8,900
Dispersibility (Mw/Mn)=1.96

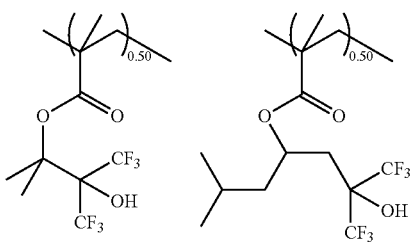

TABLE 5

| No. | Polymer (parts by mass) | Organic solvent (parts by mass) |
|---|---|---|
| TC-1 | Protective film polymer (100) | Diisoamyl ether (2,700) 2-methyl-1-butanol (270) |

Protective Film Polymer
Molecular weight (Mw)=8,800
Dispersibility (Mw/Mn)=1.69

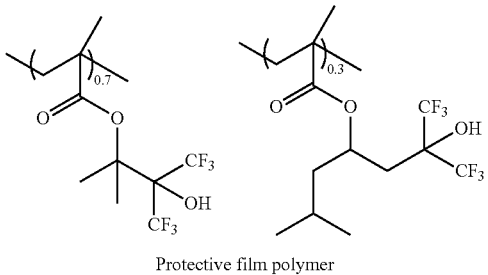

Protective film polymer

TABLE 6

| Example | Silicon-containing resist under layer film | Pattern profile of cross section after development | Pattern collapse in 42 nm |
|---|---|---|---|
| Example 1-1 | Film 1 | vertical profile | none |
| Example 1-2 | Film 2 | vertical profile | none |
| Example 1-3 | Film 3 | vertical profile | none |
| Example 1-4 | Film 4 | vertical profile | none |
| Example 1-5 | Film 5 | vertical profile | none |
| Example 1-6 | Film 6 | vertical profile | none |
| Example 1-7 | Film 7 | vertical profile | none |
| Example 1-8 | Film 8 | vertical profile | none |
| Example 1-9 | Film 9 | vertical profile | none |
| Example 1-10 | Film 10 | vertical profile | none |
| Example 1-11 | Film 11 | vertical profile | none |
| Example 1-12 | Film 12 | vertical profile | none |
| Example 1-13 | Film 13 | vertical profile | none |
| Example 1-14 | Film 14 | vertical profile | none |
| Example 1-15 | Film 15 | vertical profile | none |
| Example 1-16 | Film 16 | vertical profile | none |
| Example 1-17 | Film 17 | vertical profile | none |
| Example 1-18 | Film 18 | vertical profile | none |
| Example 1-19 | Film 19 | vertical profile | none |
| Example 1-20 | Film 20 | vertical profile | none |
| Example 1-21 | Film 21 | vertical profile | none |
| Comparative example 1-1 | Film 22 | cross section cannot be observed due to pattern collapse | pattern collapse occurred in 48 nm |

As shown in Table 6, in Examples 1-1 to 1-21, which used the composition for forming a silicon-containing resist under layer film that contains the inventive silicon-containing condensate, it was revealed that a vertical profile in the resist cross section could be obtained without pattern collapse when a composition for forming a resist upper layer film for positive development was used. On the other hand, in Comparative example 1-1, which used the composition for forming a silicon-containing resist under layer film that did not contain the inventive silicon-containing condensate, pattern collapse occurred in 48 nm.

(Pattern Etching Test: Examples 2-1 to 2-11)

By using the resist pattern obtained in the patterning test by positive development (Examples 1-11 to 1-21) as a mask, the pattern was transferred to the resist under layer film by dry etching under the following condition (1), and subsequently transferred to the organic under layer film by dry etching under the following condition (2). Then, cross-sectional shape of the obtained pattern and pattern roughness were observed with the foregoing electron microscopes. The results are shown in Table 7.

(1) Etching condition in $CHF_3/CF_4$ gas system
Device: dry etching device Telius SP manufactured by Tokyo Electron Ltd.
Etching Condition (1):

| | |
|---|---|
| Chamber pressure | 10 Pa |
| Upper/Lower RF power | 500 W/300 W |
| $CHF_3$ gas flow rate | 50 mL/min |
| $CF_4$ gas flow rate | 150 mL/min |
| Ar gas flow rate | 100 mL/min |
| Treatment time | 40 seconds |

(2) Etching condition in $O_2/N_2$ gas system
Device: dry etching device Telius SP manufactured by Tokyo Electron Ltd.
Etching condition (2):

| | |
|---|---|
| Chamber pressure | 2 Pa |
| Upper/Lower RF power | 1,000 W/300 W |
| $O_2$ gas flow rate | 300 mL/min |
| $N_2$ gas flow rate | 100 mL/min |
| Ar gas flow rate | 100 mL/min |
| Treatment time | 30 seconds |

TABLE 7

| Example | Silicon-containing resist under layer film | Pattern profile of cross section of organic under layer film after dry etching | Pattern roughness |
|---|---|---|---|
| Example 2-1 | Film 11 | vertical profile | 1.5 nm |
| Example 2-2 | Film 12 | vertical profile | 1.9 nm |
| Example 2-3 | Film 13 | vertical profile | 1.8 nm |
| Example 2-4 | Film 14 | vertical profile | 1.7 nm |
| Example 2-5 | Film 15 | vertical profile | 2.0 nm |
| Example 2-6 | Film 16 | vertical profile | 1.7 nm |
| Example 2-7 | Film 17 | vertical profile | 2.0 nm |
| Example 2-8 | Film 18 | vertical profile | 1.8 nm |
| Example 2-9 | Film 19 | vertical profile | 2.0 nm |
| Example 2-10 | Film 20 | vertical profile | 1.8 nm |
| Example 2-11 | Film 21 | vertical profile | 1.6 nm |

As shown in Table 7, it was revealed that when the composition for forming a silicon-containing resist under layer film of the present invention was used, cross-sectional shape and pattern roughness of the pattern after processing the organic under layer film was excellent as well as cross-sectional shape of the resist pattern after positive development.

[Test by Negative Development Resist]
(Patterning test: Example 3-1 and Comparative Example 2-1)

As in the foregoing patterning test using a positive resist composition, an organic under layer film was formed onto a silicon wafer. Then, the solutions of composition for forming a silicon-containing resist under layer film, Sol. 21 and 22, were each applied thereon by spin coating, and baked at 240° C. for 60 seconds to form a silicon-containing resist under layer film, Films 21 and 22, having a film thickness of 35 nm.

Thereafter, an ArF resist composition solution for negative development (NR-1) shown in Table 8 was applied onto the silicon-containing resist under layer film, and then baked at 110° C. for 60 seconds to form a photoresist film having a film thickness of 100 nm.

Next, these were exposed by an ArF immersion exposure apparatus (NSR-S6100, manufactured by Nikon Corporation, NA: 1.30, σ: 0.98/0.65, 35° polarized dipole illumination, 6% halftone phase shift mask), and baked at 100° C. for 60 seconds (PEB). Thereafter, while rotating with 30 rpm, butyl acetate was discharged for 3 seconds from a development nozzle as a developer, rotation was then stopped, and paddle development was performed for 27 seconds. The resulting wafer was rinsed with diisoamyl ether, spin dried, and baked at 100° C. for 20 seconds to evaporate the rinsing solvent. According to this patterning, 42 nm 1:1 negative line and space pattern was obtained. Then, pattern collapse after development was observed with an electron microscope (CG4000) manufactured by Hitachi High-Technologies Corporation, and cross-sectional shape was observed with an electron microscope (S-9380) manufactured by Hitachi, Ltd. The results are shown in Table 9.

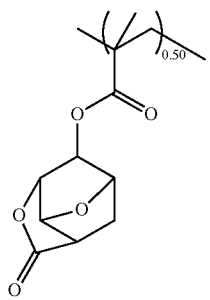

Acid generator: PAG 2

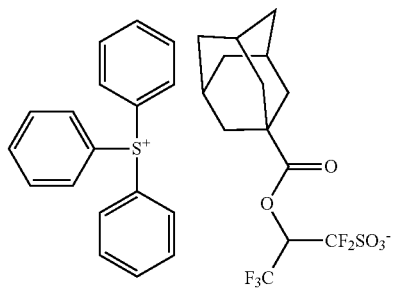

TABLE 8

| No. | ArF resist polymer (parts by mass) | Acid generator (parts by mass) | Base (parts by mass) | Water repellency polymer (parts by mass) | Solvent (parts by mass) |
|---|---|---|---|---|---|
| NR-1 | P2 (100) | PAG2 (10.0) | Q2 (2.0) | FP1 (4.0) | PGMEA (2,200) GBL (300) |

ArF resist polymer: P2
Molecular weight (Mw)=8,900
Dispersibility (Mw/Mn)=1.93

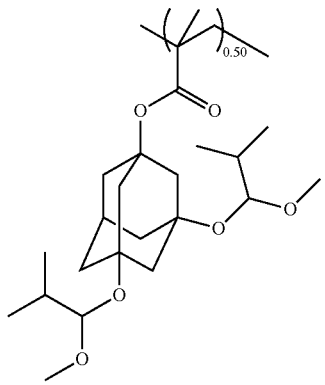

Base: Q2

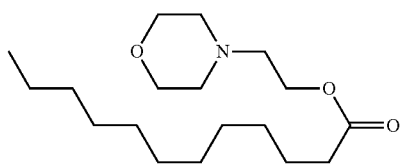 [SMILES: CCCCCCCCCCCC(=O)OCCN1CCOCC1]

TABLE 9

| Example | Silicon-containing resist under layer film | Pattern profile of cross section after development | Pattern collapse in 42 nm |
|---|---|---|---|
| Example 3-1 | Film 21 | vertical profile | none |
| comparative example 2-1 | Film 22 | cross section cannot be observed due to pattern collapse | pattern collapse occurred in 45 nm |

As shown in Table 9, in Example 3-1, which used the composition for forming a silicon-containing resist under layer film that contains the inventive silicon-containing condensate, it was revealed that a vertical profile in the resist cross section could be obtained without pattern collapse when a composition of a resist upper layer film for negative development was used. On the other hand, in Comparative example 2-1, which used the composition for forming a silicon-containing resist under layer film that did not contain the inventive silicon-containing condensate, pattern collapse occurred in 45 nm.

(Pattern Etching Test: Example 4-1)

As in the foregoing etching test of a resist pattern in positive development, except for using the resist pattern obtained in the patterning test by negative development (Example 3-1) as a mask, the pattern was transferred to the resist under layer film by dry etching under the foregoing condition (1), and subsequently transferred to the organic under layer film by dry etching under the foregoing condition (2). Then, cross-sectional shape and pattern roughness of the obtained pattern were observed with the foregoing electron microscopes. The results are shown in Table 10.

TABLE 10

| Example | Silicon-containing resist under layer film | Pattern profile of cross section of organic under layer film after dry etching | Pattern roughness |
|---|---|---|---|
| Example 4-1 | Film 21 | vertical profile | 1.9 nm |

As shown in Table 10, it was revealed that when the composition for forming a silicon-containing resist under layer film of the present invention was used, cross-sectional shape and pattern roughness of the pattern after processing the organic under layer film was excellent as well as cross-sectional shape of the resist pattern after negative development.

As described above, it has revealed that by blending the inventive silicon-containing condensate to a composition for forming a resist under layer film, it is possible to form a resist under layer film with good adhesiveness to any resist pattern, whether the pattern is formed by negative development or positive development.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A silicon-containing condensate comprising one or more repeating units selected from a repeating unit shown by the following general formula (A1), a repeating unit shown by the following general formula (A2), and a repeating unit shown by the following general formula (A3),

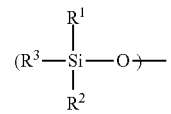

wherein $R^1$ represents a group shown by the following general formula (A-1) or the following general formula (A-2); $R^2$ and $R^3$ each independently represent the same group as $R^1$, a hydrogen atom, or a monovalent organic group having 1 to 30 carbon atoms other than $R^1$,

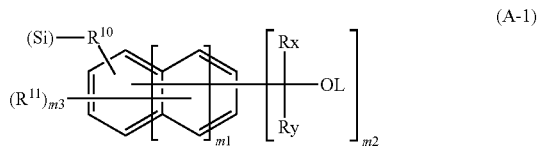

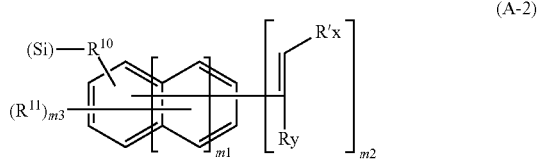

wherein $R^{10}$ represents a single bond or an alkylene group having 1 to 10 carbon atoms, and when $R^{10}$ is an alkylene group, $R^{10}$ optionally contains one or more species selected from an ether oxygen atom, a carbonyl group, and a carbonyloxy group at a site which is not directly bonded to (Si) in the formula; $R^{11}$ represents a hydrogen atom, a halogen atom, a linear, branched, or cyclic acyloxy group having 2 to 8 carbon atoms, a linear, branched, or cyclic alkyl group having 1 to 6 carbon atoms, or a linear, branched, or cyclic alkoxy group having 1 to 6 carbon atoms in which a hydrogen atom in the acyloxy group, the alkyl group, and the alkoxy group is optionally substituted with a halogen atom; Rx, R'x, and Ry each independently represent a hydrogen atom or a monovalent aliphatic hydrocarbon group having 1 to 15 carbon atoms in which a hydrogen atom in the monovalent aliphatic hydrocarbon group is optionally substituted with a hydroxy group or an alkoxy group, and each Ry optionally bonds to Rx or R'x respectively to form a cyclic structure, with the proviso that the both of Rx and Ry are not hydrogen atoms at the same time; L represents a hydrogen atom, a linear, branched, or cyclic monovalent aliphatic hydrocarbon group having 1 to 10 carbon atoms, or a monovalent aromatic group which optionally contains a substituent, and when L is a monovalent aliphatic hydrocarbon group, L optionally contains one or more species selected from an ether oxygen atom, a carbonyl group, and a carbonyloxy group; m1 in the general formula (A-1) represents an integer of 0 to 2 and m1 in the general formula (A-2) represents an interger of 2, m2 represents an integer of 1 to 3, and m3 represents an integer satisfying (5+2×m1−m2); and (Si) represents a bonding site to Si.

2. A composition for forming a silicon-containing resist under layer film, comprising:
 (A) the silicon-containing condensate according to claim 1, and
 (B) a polysiloxane compound other than the component (A).

3. The composition for forming a silicon-containing resist under layer film according to claim 2, wherein the polysiloxane compound of the component (B) contains a repeating unit derived from a tetrafunctional hydrolyzable monomer, in a ratio of 50 mol% or more of all the repeating unit in the polysiloxane compound.

4. The composition for forming a silicon-containing resist under layer film according to claim 3, wherein a mass ratio between the component (A) and the component (B) is (B)≥(A).

5. The composition for forming a silicon-containing resist under layer film according to claim 2, wherein a mass ratio between the component (A) and the component (B) is (B)≥(A).

6. A patterning process comprising: forming an organic film on a body to be processed by using a coating-type organic film material; forming a resist under layer film on the organic film by using the composition for forming a silicon-containing resist under layer film according to claim 2; forming a resist upper layer film on the resist under layer film by using a resist upper layer film material composed of a photoresist composition; forming a circuit pattern in the resist upper layer film; transferring the pattern to the resist under layer film by dry etching using the resist upper layer film having the formed pattern as a mask; transferring the pattern to the organic film by dry etching using the resist under layer film having the transferred pattern as a mask; and transferring the pattern to the body to be processed by dry etching using the organic film having the transferred pattern as a mask.

7. The patterning process according to claim 6, wherein the coating-type organic film material contains a compound having an aromatic ring.

8. The patterning process according to claim 6, wherein the circuit pattern is formed by a lithography using light with a wavelength of 10 nm or more and 300 nm or less, a direct drawing by electron beam, a nanoimprinting, or a combination thereof.

9. The patterning process according to claim 6, wherein the circuit pattern is developed by alkaline development or organic solvent development.

10. The patterning process according to claim 6, wherein the body to be processed is a semiconductor apparatus substrate or the semiconductor apparatus substrate coated with any of a metal film, a metal carbide film, a metal oxide film, a metal nitride film, a metal oxycarbide film, and a metal oxynitride film.

11. The patterning process according to claim 10, wherein the metal of the body to be processed is any of silicon, titanium, tungsten, hafnium, zirconium, chromium, germanium, copper, aluminum, indium, gallium, arsenic, palladium, iron, tantalum, iridium, molybdenum, or an alloy thereof.

12. A patterning process comprising: forming an organic film on a body to be processed by using a coating-type organic film material; forming a resist under layer film on the organic film by using the composition for forming a silicon-containing resist under layer film according to claim 3; forming a resist upper layer film on the resist under layer film by using a resist upper layer film material composed of a photoresist composition; forming a circuit pattern in the resist upper layer film; transferring the pattern to the resist under layer film by dry etching using the resist upper layer film having the formed pattern as a mask; transferring the pattern to the organic film by dry etching using the resist under layer film having the transferred pattern as a mask; and transferring the pattern to the body to be processed by dry etching using the organic film having the transferred pattern as a mask.

13. The patterning process according to claim 12, wherein the coating-type organic film material contains a compound having an aromatic ring.

14. A patterning process comprising: forming a hard mask mainly consisting of carbon on a body to be processed by a CVD method; forming a resist under layer film on the CVD hard mask by using the composition for forming a silicon-containing resist under layer film according to claim 2; forming a resist upper layer film on the resist under layer film by using a resist upper layer film material composed of a photoresist composition; forming a circuit pattern in the resist upper layer film; transferring the pattern to the resist under layer film by dry etching using the resist upper layer film having the formed pattern as a mask; transferring the pattern to the CVD hard mask by dry etching using the resist under layer film having the transferred pattern as a mask; and further transferring the pattern to the body to be processed by dry etching using the CVD hard mask having the transferred pattern as a mask.

15. The patterning process according to claim 14, wherein the circuit pattern is formed by a lithography using light with a wavelength of 10 nm or more and 300 nm or less, a direct drawing by electron beam, a nanoimprinting, or a combination thereof.

16. The patterning process according to claim 14, wherein the circuit pattern is developed by alkaline development or organic solvent development.

17. The patterning process according to claim 14, wherein the body to be processed is a semiconductor apparatus substrate or the semiconductor apparatus substrate coated with any of a metal film, a metal carbide film, a metal oxide film, a metal nitride film, a metal oxycarbide film, and a metal oxynitride film.

18. The patterning process according to claim 17, wherein the metal of the body to be processed is any of silicon, titanium, tungsten, hafnium, zirconium, chromium, germanium, copper, aluminum, indium, gallium, arsenic, palladium, iron, tantalum, iridium, molybdenum, or an alloy thereof.

19. A patterning process comprising: forming a hard mask mainly consisting of carbon on a body to be processed by a CVD method; forming a resist under layer film on the CVD hard mask by using the composition for forming a silicon-containing resist under layer film according to claim 3; forming a resist upper layer film on the resist under layer film by using a resist upper layer film material composed of a photoresist composition; forming a circuit pattern in the resist upper layer film; transferring the pattern to the resist under layer film by dry etching using the resist upper layer film having the formed pattern as a mask; transferring the pattern to the CVD hard mask by dry etching using the resist under layer film having the transferred pattern as a mask; and further transferring the pattern to the body to be processed by dry etching using the CVD hard mask having the transferred pattern as a mask.

\* \* \* \* \*